United States Patent
Li et al.

(10) Patent No.: US 11,430,494 B2
(45) Date of Patent: Aug. 30, 2022

(54) DQS POSITION ADJUSTMENT METHOD, CONTROLLER AND NETWORK DEVICE

(71) Applicant: Huawei Technologies Co., Ltd., Shenzhen (CN)

(72) Inventors: Yongyao Li, Shenzhen (CN); Jun Yu, Chengdu (CN); Guoyu Wang, Chengdu (CN); Jiankang Li, Chengdu (CN); You Li, Chengdu (CN); Ruihui Hong, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 7 days.

(21) Appl. No.: 17/097,680

(22) Filed: Nov. 13, 2020

(65) Prior Publication Data
US 2021/0065757 A1      Mar. 4, 2021

Related U.S. Application Data

(63) Continuation of application No. PCT/CN2019/076675, filed on Mar. 1, 2019.

(30) Foreign Application Priority Data

May 16, 2018   (CN) .......................... 201810468980.6

(51) Int. Cl.
*G11C 7/22* (2006.01)
*G11C 7/10* (2006.01)
*G11C 11/4076* (2006.01)

(52) U.S. Cl.
CPC ............ *G11C 7/222* (2013.01); *G11C 7/1066* (2013.01); *G11C 7/1093* (2013.01); *G11C 11/4076* (2013.01)

(58) Field of Classification Search
CPC ..... G11C 7/222; G11C 7/1066; G11C 7/1093; G11C 11/4076; G06F 13/1689
(Continued)

(56) References Cited

U.S. PATENT DOCUMENTS 7,171,321 B2 * 1/2007 Best .................... G06F 13/1689
                                                        702/106
7,443,741 B2 * 10/2008 Butt ..................... G11C 7/1006
                                                        365/174

(Continued)

FOREIGN PATENT DOCUMENTS

CN          1862701 A      11/2006
CN        101425331 A       5/2009
(Continued)

*Primary Examiner* — Son L Mai
(74) *Attorney, Agent, or Firm* — Conley Rose, P.C.

(57) ABSTRACT

A controller for data strobe signal (DQS) position adjustment includes, when the controller obtains margin effective widths of all data signals in a transmission bus, it determines a left boundary and a right boundary based on the margin effective widths, where the left boundary is a largest value in minimum values of the margin effective widths of all the DQs, and the right boundary is a smallest value in maximum values of the corresponding margin effective widths when all the DQs are aligned with the left boundary. The controller calculates a first central position based on the left boundary and the right boundary, where the first central position is a center of a smallest margin effective width obtained after all the DQs are aligned during read data training, and adjusts a delay line (DL) of the DQS to the first central position.

20 Claims, 16 Drawing Sheets

(58) Field of Classification Search
USPC .................................................. 365/193, 194
See application file for complete search history.

(56) References Cited

U.S. PATENT DOCUMENTS

| | | | |
|---|---|---|---|
| 7,818,528 B2 | 10/2010 | Hughes | |
| 7,924,637 B2 | 4/2011 | Searles et al. | |
| 8,111,565 B2* | 2/2012 | Kuroki | G11C 29/023 |
| | | | 365/193 |
| 8,565,033 B1* | 10/2013 | Manohararajah | G11C 29/023 |
| | | | 365/193 |
| 8,565,034 B1* | 10/2013 | Lu | G11C 7/22 |
| | | | 365/193 |
| 8,588,014 B1* | 11/2013 | Fung | G11C 29/022 |
| | | | 365/194 |
| 9,158,330 B1* | 10/2015 | Bar-Lev | G06F 1/10 |
| 9,401,189 B1* | 7/2016 | Ding | G11C 29/023 |
| 9,437,326 B2 | 9/2016 | Razzaz et al. | |
| 10,325,633 B2* | 6/2019 | Lee | G11C 29/022 |
| 10,366,023 B2* | 7/2019 | Kim | G11C 7/22 |
| 10,930,329 B2* | 2/2021 | Kim | G11C 7/1078 |
| 2006/0250883 A1 | 11/2006 | Szczypinski | |
| 2008/0071966 A1 | 3/2008 | Hughes | |
| 2009/0115480 A1 | 5/2009 | Jang et al. | |
| 2009/0154285 A1 | 6/2009 | Pyeon | |
| 2009/0244997 A1 | 10/2009 | Searles et al. | |
| 2010/0202223 A1 | 8/2010 | Kuroki | |
| 2010/0205386 A1 | 8/2010 | Yamashita | |
| 2012/0284576 A1 | 11/2012 | Housty et al. | |
| 2014/0089573 A1 | 3/2014 | Sakthikumar et al. | |
| 2014/0145756 A1 | 5/2014 | Chong et al. | |
| 2015/0364212 A1 | 12/2015 | Razzaz | |
| 2016/0162426 A1 | 6/2016 | Benjamin et al. | |
| 2021/0065757 A1 | 3/2021 | Li et al. | |

FOREIGN PATENT DOCUMENTS

| | | |
|---|---|---|
| CN | 101714399 A | 5/2010 |
| CN | 101897119 A | 11/2010 |
| CN | 103502964 A | 1/2014 |
| CN | 103839573 A | 6/2014 |
| CN | 104951376 A | 9/2015 |
| CN | 105679355 A | 6/2016 |
| CN | 107393578 A | 11/2017 |
| CN | 108646984 A | 10/2018 |

* cited by examiner

| Signal | Byte 0 | | Byte 1 | | Byte 2 | | Byte 3 | |
|---|---|---|---|---|---|---|---|---|
| | Hex | Bin | Hex | Bin | Hex | Bin | Hex | Bin |
| DQ 0 | 5 | 0 | A | 1 | 5 | 0 | A | 1 |
| DQ 1 | | 1 | | 0 | | 1 | | 0 |
| DQ 2 | | 0 | | 1 | | 0 | | 1 |
| DQ 3 | | 1 | | 0 | | 1 | | 0 |
| DQ 4 | A | 1 | 5 | 0 | A | 1 | 5 | 0 |
| DQ 5 | | 0 | | 1 | | 0 | | 1 |
| DQ 6 | | 1 | | 0 | | 1 | | 0 |
| DQ 7 | | 0 | | 1 | | 0 | | 1 |

Schematic diagram of a NAND flash particle

DQS POSITION ADJUSTMENT METHOD, CONTROLLER AND NETWORK DEVICE

CROSS-REFERENCE TO RELATED DISCLOSURES

This application is a continuation of International Patent Application No. PCT/CN2019/076675, filed on Mar. 1, 2019, which claims priority to Chinese Patent Application No. 201810468980.6, filed on May 16, 2018, both of which are hereby incorporated by reference in their entireties.

TECHNICAL FIELD

This disclosure relates to the field of communications technologies, and in particular, to a data strobe signal (DQS) position adjustment method and apparatus.

BACKGROUND

With continuous development of the information and communications technology (ICT) industry, customers require that storage of massive data has a fast response time and a low latency, that is, have a higher performance requirement for a quantity of read/write (I/O) operations per second (IOPS) of a storage system. In addition, with rapid development of flash memory technologies, disclosure of a flash memory becomes a trend. To achieve a high-performance requirement for the TOPS, one approach is to improve a non-volatile flash interface (NFI) bus rate between a storage controller and a new flash medium, because the NFI bus rate is a key point in improvement of storage device performance.

With continuous increase of the NFI bus rate, a problem of a timing ratio is more severe. Currently, a timing ratio of a system is affected by factors a controller, board-level interconnect, and a NAND flash (one type of flash memories). As the NFI bus rate evolves from 266 megatransfers per second (MT/s) to 533 MT/s, a higher bus rate corresponds to smaller timing ratio (which decreases from 0.34 to 0.1) of the board-level interconnect.

A typical storage system is used as an example. For example, in a large-capacity scenario such as a 2.5-inch solid-state drive (SSD), a standard card, or another type of SSD, due to impact of a cabling topology, a cabling length, cabling impedance, and the like, an effective width and a phase of a signal received by a receive end (a corresponding signal transmission destination) change greatly. Consequently, an effective width of a data signal (DQ) is reduced, and a margin of a setup time or a margin of a hold time for latching the DQ by the receive end using a DQS is insufficient, causing an error code during data reading and writing and then causing a data loss.

SUMMARY

Embodiments of the present disclosure provide a method for adjusting a central position of a margin effective width, namely, a DQS position determining method. The method is applicable to a connection bus between a controller and a NAND flash. A timing margin training method is mainly defined by integrating a delay-locked loop (DLL) module and a delay line (DL) module into the controller such that a timing relationship between a DQ and a DQ and a timing relationship between a DQS and a DQ on an NFI bus are automatically adjusted, and an adjusted signal at a receive end has a largest margin effective width, a largest margin of a setup time, and a largest margin of a hold time, thereby avoiding a data loss during high-speed reading and writing.

According to a first aspect, this disclosure provides a DQS position adjustment method. The method includes obtaining margin effective widths of all DQs in a transmission bus, where the margin effective width is a signal width in which preset data is correctly sampled by a receive end after the preset data is transmitted to the receive end in an ideal signal width at a transmit end, determining a left boundary and a right boundary based on the margin effective widths, where the left boundary is a largest value in minimum values of the margin effective widths of all the DQs, and the right boundary is a smallest value in maximum values of the corresponding margin effective widths when all the DQs are aligned with the left boundary, calculating a first central position based on the left boundary and the right boundary, where the first central position is a center of a smallest margin effective width obtained after all the DQs are aligned during read data training, and adjusting a DL of the DQS to the first central position.

With reference to the first aspect, in an implementation of the first aspect, a method for the determining a left boundary further includes setting a first position of the DQS, where no error code occurs in sampled data corresponding to the first position, adjusting the first position leftwards in a unit of N step lengths, and determining whether an error code occurs in sampled data corresponding to a first position obtained after each adjustment, and determining, until an error code occurs in sampled data corresponding to the adjusted first position, that the left boundary is a position obtained by adjusting, rightwards by M step lengths, the adjusted first position at which an error code occurs, where $1 \leq M \leq N$.

Optionally, in a first implementation of the first aspect, a process of the determining a left boundary includes setting the first position as a preset left boundary, where the left boundary may be represented by a, a preset right boundary is further included, the right boundary may be represented by b, a and b are an integral multiple of a step length N, and N is a natural number greater than 1, determining, using the preset left boundary a as an initial position, whether an error code occurs in data sampled by a DQS at the initial position, if no error code occurs, determining that the left boundary is the preset left boundary a, if an error code occurs, first coarsely adjusting a DQS position by adjusting the initial position rightwards in a unit of the step length N, then finely adjusting an obtained position leftwards in a unit of minimum step length 1, and after each adjustment of a position, checking whether an error code occurs in data corresponding to the DQS position, and if there is no error code, continuing to adjust the DQS leftwards, and determining, until an error code occurs in data corresponding to an adjusted DQS position, that the left boundary is a scale value obtained by adding one step length to the DQS position at which an error code occurs currently.

In this implementation, the preset left boundary is the initial position of the DQS. When no error code occurs at the initial position, the preset left boundary can be quickly determined as the left boundary, thereby saving a time for adjusting the DQS and improving training efficiency.

Optionally, in a second implementation of the first aspect, a process of the determining a left boundary includes setting the first position to a position obtained after a time delay of ¼ of a DQS cycle, gradually adjusting the DQS position leftwards using the first position as a start point, and detecting, one by one, whether an error code occurs in data corresponding to each DQS position, and when a first error code occurs after a position is adjusted, determining that the currently adjusted DQS position is the left boundary.

In this implementation, the DQS position is first adjusted to the position of ¼ of the DQS cycle such that the first position is located at an approximate central position relative to all the DQs, thereby facilitating separate adjustment of DQS position leftwards and rightwards relative to the central position and determining of the DQS position. Therefore, the left boundary can be quickly determined, saving an adjustment time.

With reference to the first aspect, in an implementation of the first aspect, a method for the determining a left boundary further includes setting a second position of the DQS, where an error code occurs in sampled data corresponding to the second position, adjusting the second position rightwards in a unit of P step lengths, and determining whether an error code occurs in sampled data corresponding to a second position obtained after each adjustment. Further, based on a size of the step length P, the method may include the following two cases, if $P \geq 2$, adjusting the second position until no error code occurs in sampled data corresponding to the adjusted second position, and determining that the left boundary is a position obtained by adjusting, leftwards by Q step lengths, a currently adjusted second position at which no error code occurs, where $1 \leq Q \leq P$, and if $P=1$, adjusting the second position until no error code occurs in sampled data corresponding to the adjusted position, and determining that the left boundary is the currently adjusted position.

With reference to the first aspect, in another implementation of the first aspect, a method for the determining a right boundary further includes adjusting DLs of all the DQs using the left boundary as a reference such that the minimum values of the margin effective widths of all the DQs are equal to the left boundary, keeping the margin effective widths of all the DQs unchanged, and determining the smallest margin effective width of all the DQs in the transmission bus, and determining that the right boundary is a maximum value of the smallest margin effective width, namely, a maximum scale value of the aligned smallest margin effective width.

Optionally, after the margin effective widths of all the DQs are left aligned, a process of the determining a right boundary further includes gradually adjusting the DQS position rightwards from the left boundary, for example, adjusting the DQS position each time in a unit of the step length N, and then detecting, one by one, whether an error code occurs at each adjusted DQS position, when an error code occurs for the first time after the DQS position is adjusted, determining that the right boundary is a scale value obtained by subtracting one unit step length from the DQS position at which an error code occurs currently for the first time, where the DQS position at which an error code occurs for the first time is a smallest value of maximum values of all margin effective widths that are left aligned.

With reference to the first aspect, in still another implementation of the first aspect, the method further includes writing and reading, by a controller, the preset data at a normal rate, determining a second central position, where during write data training, the second central position is a center of a smallest margin effective width obtained after all the DQs are aligned, adjusting a DL of the DQS to the second central position, and assigning the first central position and the second central position to a DQS register, and assigning, to a DQ register, DL lengths of each DQ that are adjusted relative to the first central position and the second central position.

A process of the determining a second central position is similar to the foregoing process of determining the first central position, and includes first adjusting a DL of the DQS such that an edge of the DQS signal is aligned with a left boundary of the margin effective width of the DQ signal, then automatically adjusting DLs of all the DQs such that the left boundary of all the DQs are aligned with a current position of the DQS, to determine the left boundary, then adjusting the DL of the DQS such that the edge of the DQS is aligned with a right boundary of the margin effective widths of the DQ signals, to determine the right boundary, and finally calculating an average of the left boundary and the right boundary, and using the average as the second central position.

With reference to the first aspect, in yet another implementation of the first aspect, before the obtaining margin effective widths of all DQs in a transmission bus, the method further includes performing a calibration operation on a terminal matching resistor in the transmission bus during power-on or reset, after the calibration operation on the terminal matching resistor is completed, detecting whether a bus rate in the transmission bus is greater than a threshold, and if the bus rate is greater than the threshold, performing the step of determining a left boundary and a right boundary based on the margin effective widths, or if the bus rate is less than or equal to the threshold, entering a normal operation state.

With reference to the first aspect, in still yet another implementation of the first aspect, before the obtaining margin effective widths of all DQs in a transmission bus, the method further includes obtaining an operation mode of an NFI bus, determining a minimum rate in the operation mode of the NFI bus based on the operation mode of the NFI bus and a correspondence between the operation mode of the NFI bus and a bus rate, writing the preset data to a data register of a NAND flash at the minimum rate, and obtaining the preset data from the data register of the NAND flash.

According to a second aspect, this disclosure further provides a DQS position adjustment apparatus. The apparatus includes units configured to perform the steps in the first aspect and the implementations of the first aspect. Optionally, the apparatus includes an obtaining unit, a processing unit, and a sending unit. In addition, the apparatus may further include another function module or unit such as a storage unit. This is not limited in this disclosure.

According to a third aspect, this disclosure further provides a controller. The controller includes a control circuit, a drive circuit, a storage medium, and the like. The control circuit is connected to the drive circuit, and the drive circuit includes a flash I/O interface configured to implement data transmission between the controller and a flash particle.

Further, the control circuit is configured to perform the following functions obtaining margin effective widths of all DQs in a transmission bus, where the margin effective width is a signal width in which preset data is correctly sampled by a receive end after the preset data is transmitted to the receive end in an ideal signal width at a transmit end, determining a left boundary and a right boundary based on the margin effective widths, where the left boundary is a largest value in minimum values of the margin effective widths of all the DQs, and the right boundary is a smallest value in maximum values of the corresponding margin effective widths when all the DQs are aligned with the left boundary, calculating a first central position based on the left boundary and the right boundary, where the first central position is a center of a smallest margin effective width obtained after all the DQs are aligned during read data training, and adjusting a DL of the DQS to the first central position.

With reference to the third aspect, in an implementation of the third aspect, the control circuit is further configured to set a first position of the DQS, where no error code occurs in sampled data corresponding to the first position, adjust the first position leftwards in a unit of a step length N, and determine whether an error code occurs in sampled data corresponding to a first position obtained after each adjustment, and determine, until an error code occurs in sampled data corresponding to the adjusted first position, that the left boundary is a position by adjusting, rightwards by M step lengths, the adjusted first position at which an error code occurs, where $1 \leq M \leq N$.

With reference to the third aspect, in another implementation of the third aspect, the control circuit is further configured to set a second position of the DQS, where an error code occurs in sampled data corresponding to the second position, adjust the second position rightwards in a unit of P step lengths, and determine whether an error code occurs in sampled data corresponding to a second position obtained after each adjustment, and if $P \geq 2$, adjust the second position until no error code occurs in sampled data corresponding to the adjusted second position, and determine that the left boundary is a position obtained by adjusting, leftwards by Q step lengths, a currently adjusted second position at which no error code occurs, where $1 \leq Q \leq P$, or if $P=1$, adjust the second position until no error code occurs in sampled data corresponding to the adjusted position, and determine that the left boundary is the currently adjusted position.

With reference to the third aspect, in still another implementation of the third aspect, the control circuit is further configured to adjust DLs of all the DQs using the left boundary as a reference such that the minimum values of the margin effective widths of all the DQs are equal to the left boundary, determine the smallest margin effective width of all the DQs in the transmission bus, and determine that the right boundary is a maximum value of the smallest margin effective width.

With reference to the third aspect, in yet another implementation of the third aspect, the control circuit is further configured to write and read the preset data at a normal rate, determine a second central position, where during write data training, the second central position is a center of a smallest margin effective width obtained after all the DQs are aligned, adjust a DL of the DQS to the second central position, and assign the first central position and the second central position to a DQS register, and assign, to a DQ register, DL lengths of each DQ that are adjusted relative to the first central position and the second central position.

With reference to the third aspect, in still yet another implementation of the third aspect, the control circuit is further configured to, before the margin effective widths of all the DQs in the transmission bus are obtained, perform a calibration operation on a terminal matching resistor in the transmission bus during power-on or reset, after the calibration operation on the terminal matching resistor is completed, detect whether a bus rate in the transmission bus is greater than a threshold, and if the bus rate is greater than the threshold, perform the step of determining a left boundary and a right boundary based on the margin effective widths, or if the bus rate is less than or equal to the threshold, enter a normal operation state.

With reference to the third aspect, in a further implementation of the third aspect, the control circuit is further configured to, before the margin effective widths of all the DQs in the transmission bus are obtained, obtain an operation mode of an NFI bus, determine a minimum rate in the operation mode of the NFI bus based on the operation mode of the NFI bus and a correspondence between the operation mode of the NFI bus and a bus rate, write the preset data into a data register of a NAND flash at the minimum rate, and obtain the preset data from the data register of the NAND flash.

With reference to the third aspect, in a still further implementation of the third aspect, the control circuit includes a DQ 0 register to a DQ 7 register, a DQS register, a DQS_N register, several DL modules, and one DLL module. The DQ 0 register to the DQ 7 register are configured to register a DL value for which each DQ needs to be delayed, a DL 1 module is configured to delay the time when eight DQs of a DQ 0 to a DQ 7 are triggered in a read direction, a DL 2 module is configured to delay the time when eight DQs of the DQ 0 to the DQ 7 are triggered in a write direction, a DL 3 module is configured to delay the time when the DQS are triggered in the read direction, a DL 4 module is configured to delay the time when the DQS are triggered in the write direction, and the DLL module is configured to obtain a DQS cycle.

According to a fourth aspect, this disclosure further provides a network device. The network device includes a transceiver, a controller, and a memory. The controller is configured to read an instruction stored in the memory, to further implement the DQS position adjustment method according to the first aspect and implementations of the first aspect. Optionally, the controller includes a processor, for example, a central processing unit (CPU).

According to a fifth aspect, this disclosure further provides a computer storage medium. The computer storage medium may store a program. When the program is executed, some or all steps in the embodiments of the DQS position adjustment method provided in this disclosure can be implemented.

According to a sixth aspect, this disclosure further provides a computer program product. When the computer program product is run on a computer, the computer is enabled to perform the method in the foregoing implementations.

According to the method provided in this disclosure, the left boundaries of the margin effective widths of all the DQs are aligned, a center of the smallest one of the margin effective widths is selected as the first central position, and the DL of the DQS is adjusted to be at the first central position such that a margin of a setup time and a margin of a hold time in which a DQS samples a DQ at the central position are maximized, thereby avoiding an error code during data reading and writing, and improving reliability of data read and write operations.

In addition, according to the method, optimization precision and efficiency of a sampling point can be further greatly improved, to ensure that a transmission link can work reliably in different states such as process corners, voltages, and temperatures, and a higher transmission rate is supported.

DESCRIPTION OF EMBODIMENTS

To enable a person skilled in the art to better understand technical solutions in embodiments in this disclosure, and to make objectives, features, and advantages of the embodiments in this disclosure clearer and more comprehensible, the following further describes the technical solutions of the embodiments in this disclosure in detail with reference to the accompanying drawings.

Before the description of the technical solutions of the embodiments in this disclosure, a disclosure scenario and related concepts in the embodiments in this disclosure are first described with reference to the accompanying drawings.

Figure 1:
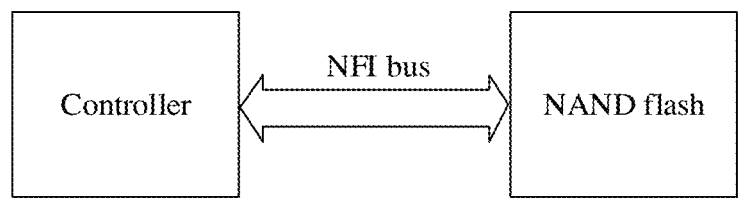
FIG. 1 is a schematic diagram of an NFI bus according to this disclosure.

The disclosure scenario in the technical solutions of this disclosure may be a scenario used in an NFI bus control field, for example, as shown in FIG. 1, an NFI bus is used between a controller and a NAND flash particle, to increase a timing margin of the NFI bus between the controller and the NAND flash. The NAND flash may be the following storage mediums in various forms, for example, an SSD disk, an add-in-card (AIC), and next-generation form-factor (NGFF) (M.2), and secure digital (SD) card, an embedded multimedia card (eMMC), a universal flash storage (UFS), and various types of flash devices such as a custom type.

Further, the NAND flash is one type of flash memory, and is internally in a non-linear macro unit mode such that a low-cost and effective solution for a solid-state and large-capacity memory is provided. The NAND flash has advantages such as a large capacity and a fast rewriting speed, and is applied to storage of a large amount of data. The NAND flash is also widely used, for example, embedded products including a digital camera, an MP3 player memory card, a compact Universal Serial Bus (USB) flash drive, and the like.

The timing margin is a time remained after a requirement of a setup time and a hold time at a receive end is met. In other words, if a DQ lasts longer than the setup time and the hold time respectively before and after a clock edge is triggered, the exceeded components are referred to as a margin of the setup time and a margin of the hold time respectively.

The setup time is a time in which data remains unchanged before a rising edge of a clock signal of a trigger arrives. An input signal needs to arrive at a chip a time T earlier than the rising edge of the clock (if the rising edge is active), and T is the setup time. If the setup time is not met, data cannot be recorded in the trigger in a current clock cycle, and the data can be recorded in the trigger until a next rising edge of the clock arrives. In other words, to properly latch a DQ inside a device, the signal needs to arrive at a receive end ahead of a clock edge. In other words, a setup time at the receive end is a time that needs to effectively exist at an input end before the data is triggered by the clock edge.

The hold time is a time in which data remains unchanged after a rising edge of a clock signal of a trigger arrives (the data remains unchanged such that the data can be stably read). In other words, if a DQ wants to be latched correctly, the DQ needs to be kept in an input buffer end for a period of time. In this way, a clock edge can have enough time to trigger access. This minimum duration may be referred to as a hold time.

Generally, the setup time is a time for which an input signal has been stably waited when a pulse signal arrives, and the hold time is a time before the input signal arrives at a falling edge and after the pulse signal arrives.

Figure 2:
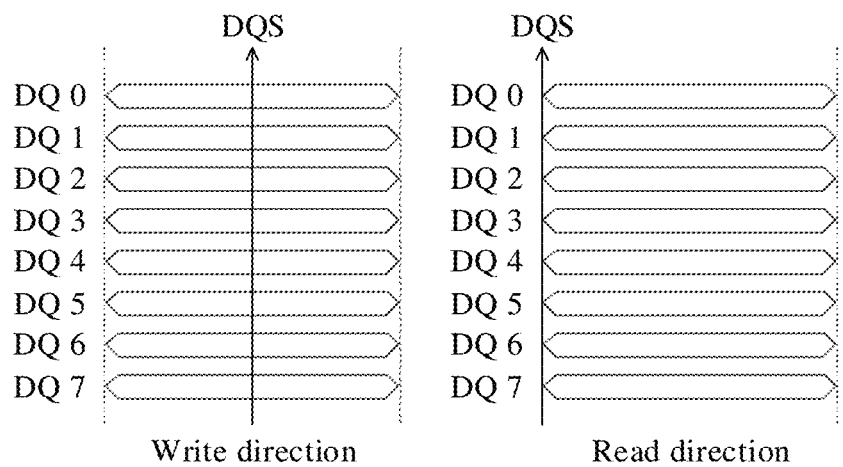
FIG. 2 is a schematic diagram of an ideal timing at a transmit end according to this disclosure.

The DQ is a set of DQs in an NFI bus. For example, the NFI bus includes eight lines, each line may be used to transmit one DQ. The eight lines of the NFI bus are numbered from 0, and a group of DQ signals is generated. As shown in FIG. 2, a DQ 0 to a DQ 7 are respectively in the eight data lines.

A timing ratio is a ratio of each timing parameter to an ideal data width.

A DQS, or referred to as a data selection pulse, is a bidirectional signal, and is generated by a NAND flash when a controller reads data on the NAND flash, and a rising edge or a falling edge (collectively referred to as an edge) of the DQS is aligned with an edge of the data. When the controller writes data into the NAND flash, the DQS is generated by the controller, and the edge of the DQS is aligned with a data central position. In this case, the edge of the DQS is at a central position of a timing margin.

The following describes problems that effective width of a DQ is reduced and a margin of a setup time or a margin of a hold time for latching the DQ by a DQS is insufficient when an effective width and a phase of a signal at a receive end change greatly. The principle is described below.

There are operations in two directions in data storage a write direction (also referred to as a write operation) and a read direction (also referred to as a read operation). The write direction (write operation) is an operation process in which a controller transfers or loads data to a NAND flash, and the read direction (read operation) is an operation process in which the NAND flash transmits data to the controller.

Referring to FIG. 2, in a write direction, edges of all initial DQs at an NFI bus write direction transmit end (on a controller side) are aligned, and a DQS is aligned with the center of the DQs, in read direction, edges of all initial DQs at a read direction transmit end (on a NAND flash side) are aligned, and a DQS is aligned with the edges of the DQs.

After the DQ and the DQS pass through a transmission link among a controller, board-level interconnect, and a NAND flash, an effective width and a phase of the signal at the receive end usually change greatly, for example, are affected by an environment such as process, voltage, temperature (PVT). In addition, because the controller cannot automatically adjust a phase of the DQS and a phase of the DQ, the presented effective width of each DQ is different, and edges of the DQs are no longer aligned.

Figure 3:
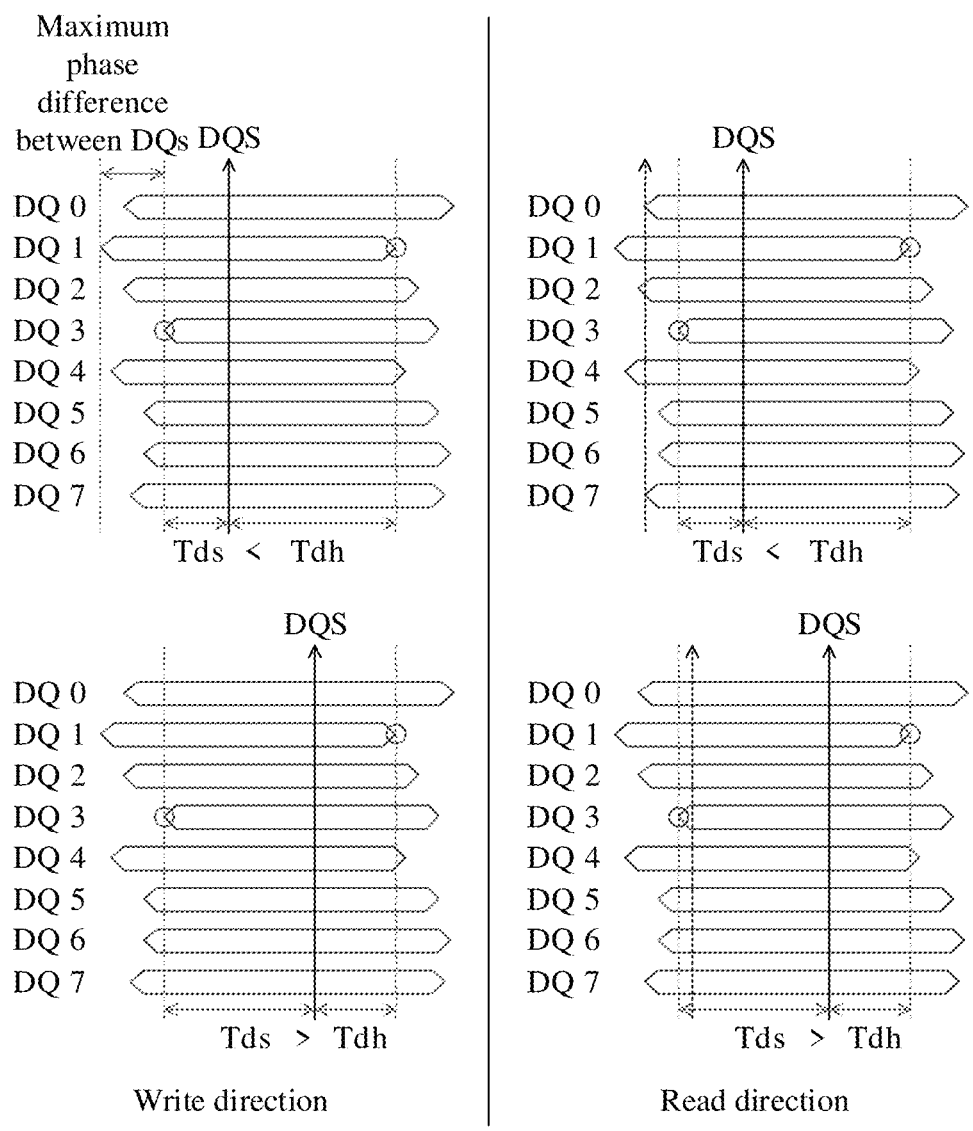
FIG. 3 is a schematic diagram of an actual timing at a receive end according to this disclosure.

Similarly, as shown in FIG. 3, in a write direction, an edge of a DQS is not aligned with the center of the DQ at a receive end (on a NAND flash side), in a read direction, an edge of a DQS is not aligned with an edge of a DQ either at a receive end (on a controller side). That is, at the receive end, a data setup time (Tds) may be greater than or less than a data hold time (Tdh).

In addition, a maximum deviation of misalignment between effective widths of all received DQs can be characterized by a "maximum phase difference".

Specifically, concepts of an effective width and a margin effective width are described below.

Figure 4:
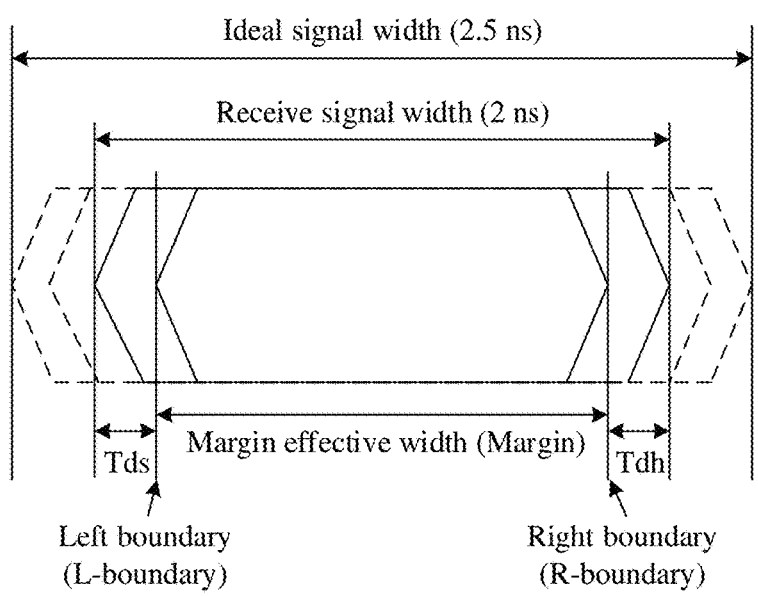
FIG. 4 is a schematic diagram of a margin effective width according to this disclosure.

The effective width can be defined as a signal width in which data is actually obtained by a receive end after the data arrives at the receive end in an ideal width at a transmit end after being attenuated when passing through a transmission path. The margin effective width is a signal width in which preset data is correctly sampled by a receive end after the preset data is transmitted to the receive end in an ideal signal width at a transmit end. Compared to the effective width, the margin effective width is a time remained after the data setup time Tds and the data hold time Tdh are subtracted, as shown in FIG. 4.

Figure 5:
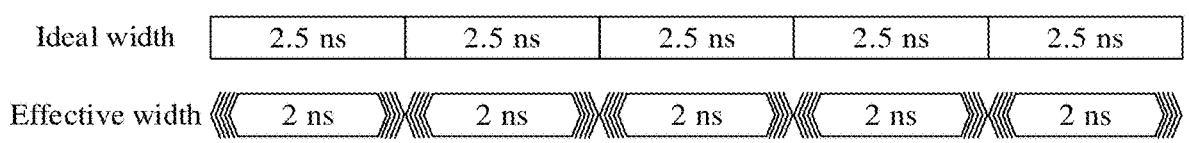
FIG. 5 is a schematic diagram of an ideal width of a signal and an actual effective width of the signal according to this disclosure.

For example, if a total of n bits can be transmitted in a DQS cycle, for example, at a transmission rate of 400 megabits per second (Mbps), namely, transmission of $4 \times 10^8$ bits per second, a time used to transmit each bit is 1 second (s)/($4 \times 10^8$)=2.5 nanoseconds (ns). In other words, an ideal signal width corresponding to each bit is 2.5 ns. After data passes through a transmission path and arrives at a receive end, the ideal signal width is reduced, and an actual effective signal width of the data correctly received at the receive end is 2 ns, as shown in FIG. 5.

Herein, bits per second (bps) is a unit of a bit rate, and the bit rate is a rate at which a signal (represented by a digital binary bit) is processed or transmitted by a system (a device, a radio wave, or a wire), namely, an amount of data processed or transmitted in a unit time. The unit bps can be used to indicate a connection speed, a transmission speed, a channel capacity, a maximum throughput, a digital bandwidth capacity, and the like in the communications field. In this disclosure, the unit can be used to indicate a bus rate for transmission between a controller and a NAND flash.

In addition, the "margin effective width" is equivalent to the "timing margin", and a difference lies only in that, in this disclosure, to measure the "timing margin", a concept of the "margin effective width" is defined. The term "margin" can be translated into "margin" in English, and the "margin" in this disclosure may refer to the "margin effective width".

A value of an effective width and a value of a phase of a signal at a receive end are not fixed. For example, a phase difference between two DQ signals may be too large, and therefore, an offset of the DQS relative to optimal sampling time point of the DQ is excessively large (Tds Tdh). Consequently, a margin of the setup time or a margin of the hold time at the receive end is insufficient, and there is an error code or an error code occurs during data reading and writing, resulting in a data loss.

Figure 6:
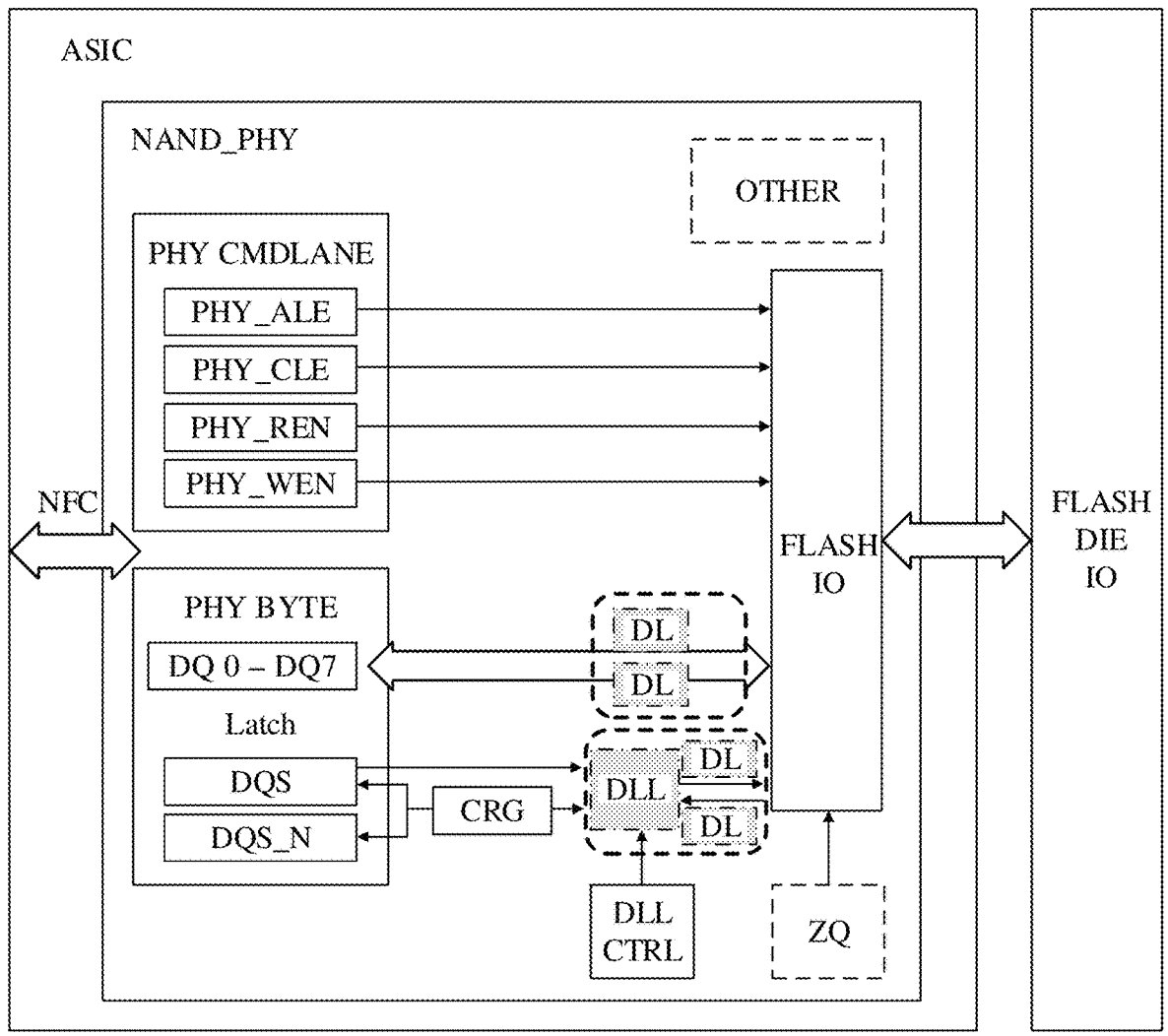
FIG. 6 is a schematic structural diagram of a DLL/DL module of a controller according to this disclosure.

An embodiment of this disclosure provides a solution to the foregoing problem. A DLL module and DL modules are integrated into a controller, as shown by a frame line in the FIG. 6. A set of timing training method is software defined to implement automatic adjustment of timing relationships between a DQ and a DQ, a DQS and a DQ on an NFI bus such that a margin effective width, a margin of the setup time, and a margin of the hold time of a signal at a receive end are maximized, to meet a specification requirement, avoiding occurrence of an error code during data reading and writing, resulting in a data loss.

Figures 7, 8:
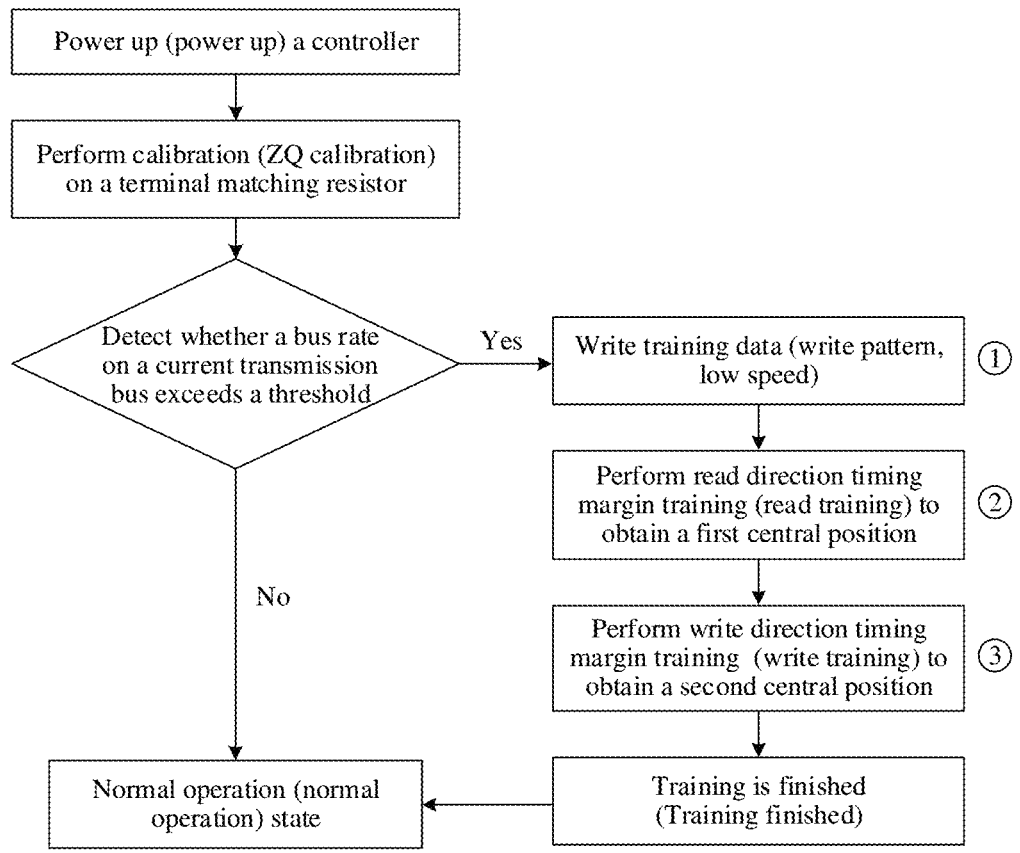
FIG. 7 is a flowchart of a timing margin training method according to this disclosure.
FIG. 8 is a schematic diagram of a custom timing training data list according to this disclosure.

As shown in FIG. 7, a principle of the technical solution in this disclosure is as follows. After a controller is powered up/reset, a calibration (ZQ Calibration) operation is performed on a terminal matching resistor in a transmission bus and the controller. After the ZQ calibration is completed, whether a bus rate in a current transmission bus exceeds a threshold (for example, 400 Mbps) is detected. If the threshold is exceeded, timing training in a read direction and a write direction are separately performed on preset data, to determine a time point or a position at which a DQS latches a DQ, to maximize an effective width of the DQ, and search for an optimal sampling point position of the DQS relative to the DQ, thereby implementing a maximum margin of the setup time and a maximum margin of the hold time at the receive end.

If the controller detects that the bus rate is less than or equal to the threshold, the controller directly enters a normal operation state.

Further, a method procedure provided in this disclosure mainly includes the following steps. ① Write training data. ② Perform read direction timing margin training, to obtain a first central position. ③ Perform write direction timing margin training, to obtain a second central position. Specific implementation details are as follows.

① The controller writes preset data (write Pattern) for timing training.

The controller obtains an operation mode of a NFI bus, and determines a minimum rate in the operation mode of the NFI bus based on the operation mode of the NFI bus and a correspondence between the operation mode and a rate. Then the controller writes the preset data into a data register of the NAND flash at a low rate corresponding to the mode, and finally obtains the preset data from the data register of the NAND flash.

Specifically, as shown in Table 1, the NFI bus has four operation modes or operating modes single data rate (SDR), non-volatile double data rate (NV-DDR), NV-DDR2, and NV-DDR3. Each mode corresponds to a different bus rate range. For example, in the SDR mode, a corresponding bus rate ranges from 10 Mbps to 50 Mbps. In this case, it can be determined that the preset data is written at a minimum rate of 10 Mbps in the SDR mode.

It should be noted that in a process of low-rate writing, the minimum rate needs to be supported by both the controller and the NAND flash. If the minimum rate is not supported by either of the devices, a higher rate needs to be reselected. For example, if a minimum rate supported by the controller is 20 Mbps and the minimum rate of 10 Mbps is not supported, the controller determines that 20 Mbps is used as the minimum rate for writing training data, to avoid a data error in the bus due to factors such as board-level interconnect. Therefore, low-rate writing is used to ensure accuracy of data in read and write operations.

Figure 9:
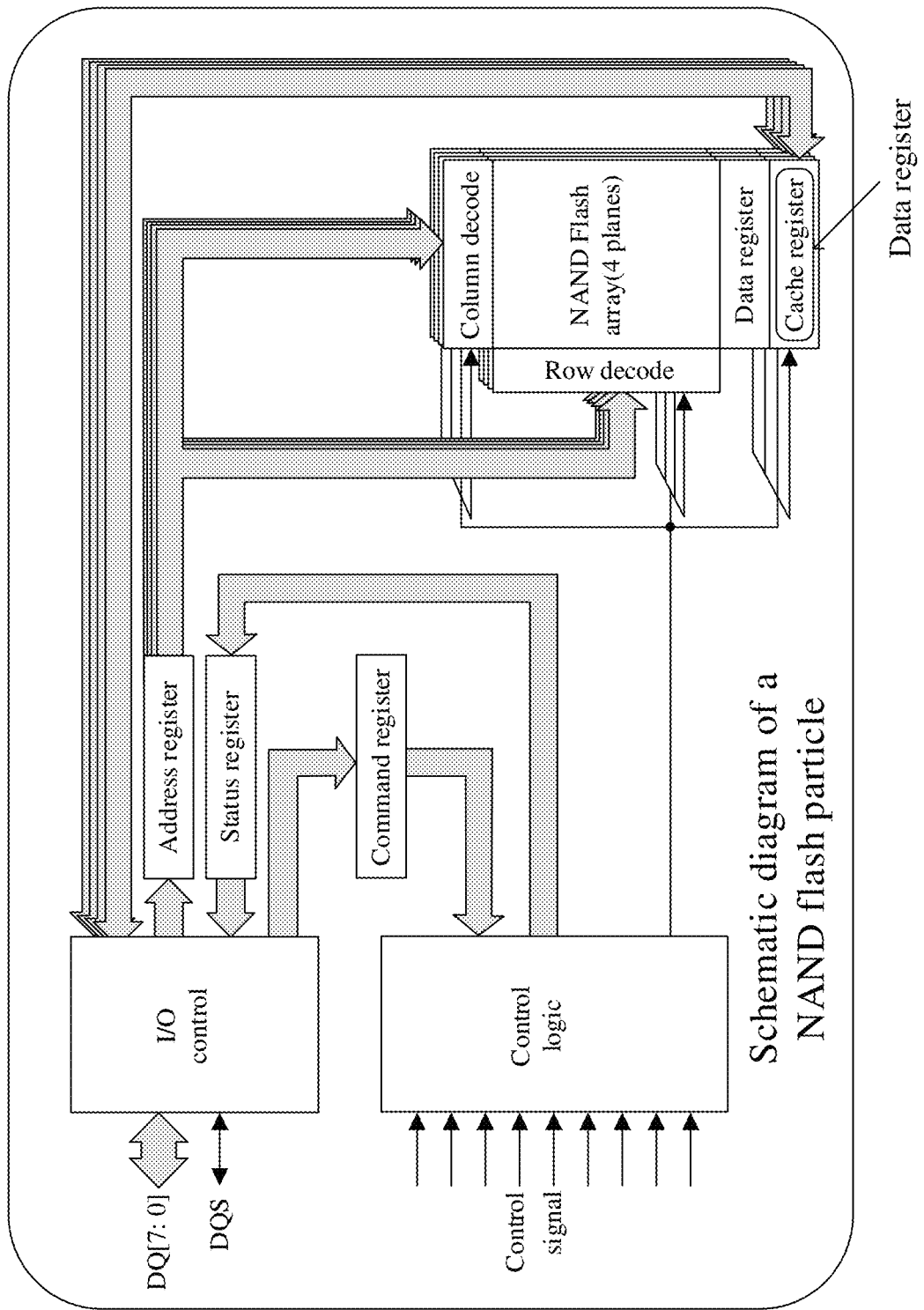
FIG. 9 is a schematic diagram of a NAND flash particle according to this disclosure.

In addition, for a representation form of preset data or custom data written by the controller, refer to FIG. 8. For example, 0x5AA55AA5 . . . indicates that preset data "5AA55AA5" is written into a data register (Cache register) of a NAND flash. FIG. 9 is a schematic diagram of a NAND flash particle. After the preset data is written, the controller restores the NFI bus to a normal operating frequency (for example, 400 Mbps).

TABLE 1

| Operation mode | Rate (Mbps) |
| --- | --- |
| SDR | 10-50 |
| NV-DDR | 40-200 |
| NV-DDR2 | 66-800 |
| NV-DDR3 | 66-1200 |

② The controller performs read direction timing margin training (Read Training) on the preset data, to obtain the first central position.

The controller reads the data written into the data register of the NAND flash in step ①, and performs timing training (training) in the read direction, to obtain a first central position of a margin effective width.

Figure 10:
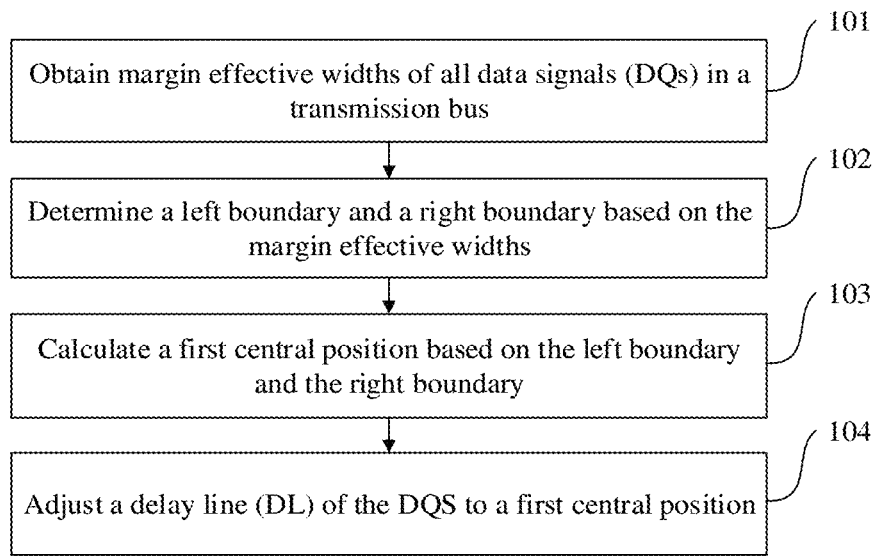
FIG. 10 is a flowchart of a DQS position adjustment method according to this disclosure.

As shown in FIG. 10, a detailed process further includes the following steps.

Step 101. A controller obtains margin effective widths of all DQs in a transmission bus, where the margin effective width is a signal width in which preset data is correctly sampled by a receive end after the preset data is transmitted to the receive end in an ideal signal width at a transmit end. The margin effective width is a length of a time remained after Tds and Tdh are subtracted.

The correct sampling means that the receive end cannot detect any error code in received sampled data.

Step 102. The controller determines a left boundary (L_Boundary) and a right boundary (R_Boundary) based on the margin effective widths, where the left boundary is a largest value in minimum values of the margin effective widths of all the DQs, and the right boundary is a smallest value in maximum values of the corresponding margin effective widths when all the DQs are aligned with the left boundary.

Step 103. The controller calculates a first central position based on the left boundary and the right boundary, where the first central position is a center of a smallest margin effective width obtained after all the DQs are aligned during read data training.

The first central position is an average value of the left boundary and the right boundary. In other words, centring=−(L_Boundary−R_Boundary)/2.

Step 104. The controller adjusts a DL of the DQS to the first central position such that an edge of the DQS signal is located at a center point (Centring) of the margin effective width of the DQ.

In addition, the method further includes assigning, by the controller, a DL value corresponding to the first central position to a DQS register, and assigning a DL value of each DQ to a corresponding DQ register, where the DL value of each DQ is a value obtained by converting a length that needs to be adjusted for aligning each DQ with the edge of the DQS into a scale unit corresponding to the DQ.

Optionally, a scale of the DQS is different from the scale of the DQ. Specifically, the DQS signal has a larger quantity of scale values. For example, there are a total of 1024 tap numbers, and a time represented by a unit scale is determined based on a DQS cycle, that is, is obtained by dividing, by 1024, the DQS cycle measured by a DLL. The DQ signal has a smaller quantity of scale values. For example, there are a total of 20 tap numbers, and a time represented by a unit scale is fixed (determined by precision of a hardware circuit). Further, the scale unit may be set to 5 picoseconds (ps), 10 ps, 20 ps, or the like.

③ The controller performs write direction timing margin training (Write Training), to obtain a second central position.

After completing the training in a read direction, the controller writes preset data or custom data at a normal rate, then sends a read command to read the data that is just written, and performs timing training in the write direction.

The preset data or the custom data that is written may be the same as or different from preset data in the read direction. This is not limited in this embodiment of this disclosure.

After the training in the write direction is completed, a DL corresponding to the second central position is assigned to a DQS register, and a DL value of each DQ is assigned to a corresponding DQ register. The DL value of each DQ is a value obtained by converting a length that needs to be adjusted for aligning each DQ with the edge of the DQS into a scale unit corresponding to the DQ.

According to the method provided in this embodiment, the controller writes training data at a low rate, then sends the read command to read the training data, and performs the timing training in the read direction. The controller determines the first central position in the read direction of training using values of the left and right boundaries of the margin effective width of each DQ in the transmission bus, automatically adjusts a DL of the DQ signal on a controller side to maximize the margin effective widths of all the DQ signals, and adjusts the DL of the DQS signal to the first central position such that the edge of the DQS signal is located at an optimal sampling point of the DQ signal, to avoid an error code during data reading and writing, and improve reliability of data read and write operations.

The controller writes the custom data at the normal rate, then sends the read command to read the data that is just written, and performs the timing training in the write direction to determine the second central position. Then the controller automatically adjusts the DL of the DQ signal of the controller to maximize the margin effective widths of all the received DQ signals, and the controller adjusts the DL of the DQS signal to the second central position such that the edge of the DQS signal received by a NAND flash receive end is located at an optimal sampling point of the DQ signal.

In addition, according to the method, optimization precision and efficiency of a sampling point can be further greatly improved, to ensure that a transmission link can work reliably in different states such as process corners, voltages, and temperatures, and a higher transmission rate is supported.

In step ② in this embodiment in this disclosure, in a process in which the controller determines the left boundary and the right boundary, three specific implementations are respectively provided below.

Manner 1. Determine the left boundary and the right boundary based on a preset boundary range [a, b].

Manner 2. Determine the left boundary and the right boundary by adjusting a DQS position leftwards and rightwards using ¼ of a DQS cycle as a start position.

Manner 3. Determine the left boundary and the right boundary by gradually adjusting the DQS position from the left to the right from an initial scale value.

The foregoing three manners are separately described in detail below. First, to facilitate indicating the DQS position, a scale value (tap number) is used for indication. Specifically, a DL hardware circuit may be used to divide the DQS cycle, and control a DL delay position of the DQS. For example, the DQS cycle is divided into 1024 unit scale values, and the scale values are sequentially numbered from the left to the right. At a specific sampling time in the DQS cycle, a sampled position may be indicated using a scale value obtained through division.

The DQS cycle may be obtained through DLL measurement.

In addition, similarly, the DL value of each DQ may also be indicated using a scale value, and a unit scale value of the DQ may be the same as a unit scale value of the DQS, or may be less than the unit scale value of the DQS. Alternatively, the scale value of the DQ may be determined based on a time case. This is not limited in this disclosure.

Manner 1.

Figure 11:
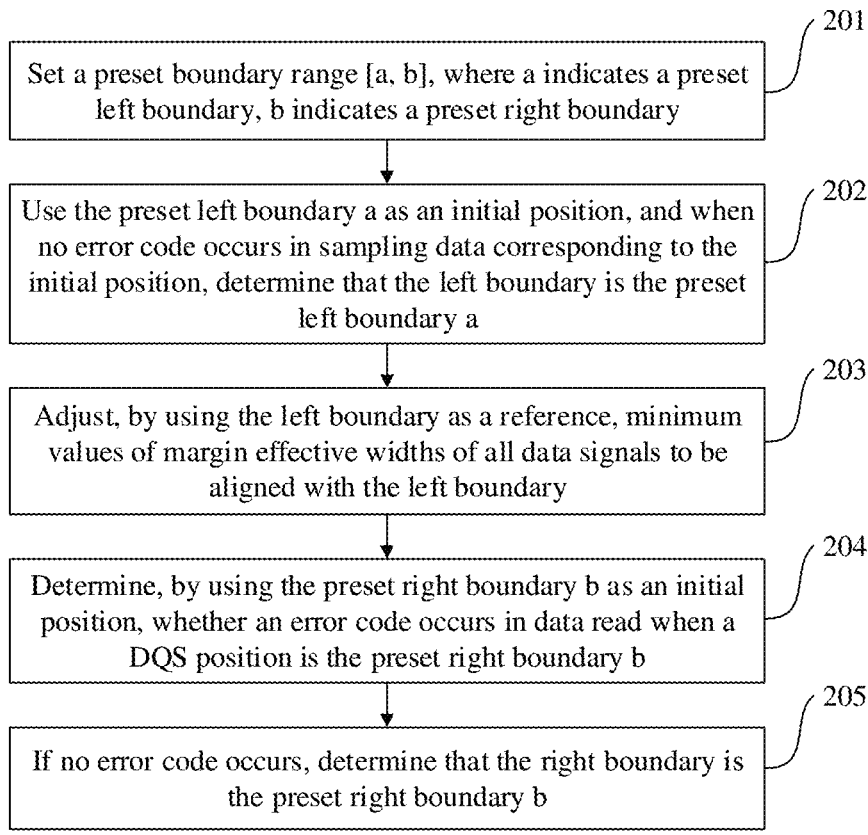
FIG. 11 is a flowchart of determining a value of a left boundary and a value of a right boundary in a first manner according to this disclosure.

As shown in FIG. 11, the method includes the following steps.

Step 201. A controller sets a preset boundary range [a, b], where a indicates a preset left boundary (startcase), b indicates a preset right boundary (endcase), a and b are an integral multiple of step length N, and N is a natural number greater than 1.

Step 202. The controller uses the preset left boundary a as an initial position, and when no error code occurs in sampled data corresponding to the initial position, the controller determines that the left boundary is the preset left boundary a.

The step 202 includes detecting whether data read and sampled at a DQS position is the same as data that is written in advance, and if the read data is different from the data that is written in advance, determining that an error code occurs in the data, or if the read data is the same as the preset data, determining that the data is correct (no error code occurs).

Specifically, for example, data written by the controller into a NAND flash in advance is "1010", and if the data received/read by a receive end is "1100" that is different from previously written "1010", it is considered that an error code occurs. Further, detecting that an error code occurs in data at an initial position i can be understood as that a setup time corresponding to the detected DQS position is less than a preset setup time.

Figure 12A:
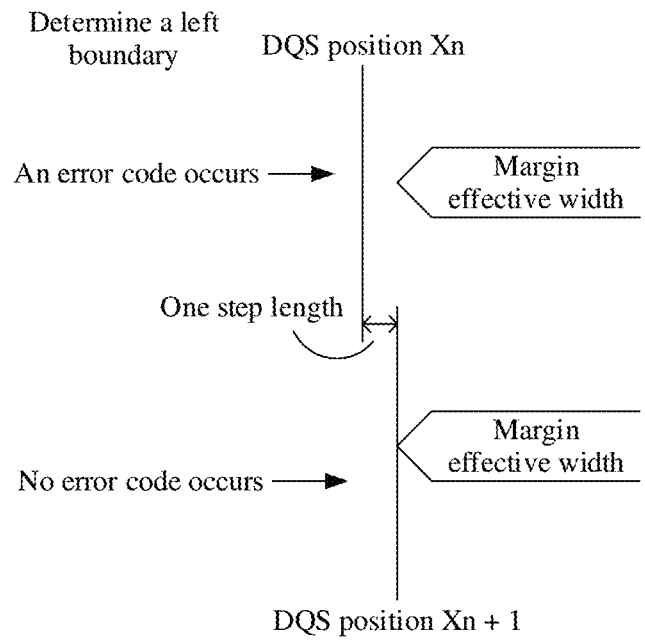
FIG. 12A is a schematic diagram of determining a value of a left boundary according to this disclosure.

As shown in FIG. 12A, when data is sampled at a DQS position $X_n$, there is no intersection between a margin effective width of a DQ and the DQS position, and there is an error code, after one unit step length is added, the DQS position $X_{n+1}$ intersects with a left end point of the margin effective width of the DQ, indicating that no error code occurs.

As shown in FIG. 11, the method further includes the following steps.

If there is an error code, the first position is first adjusted rightwards in a unit of N step lengths, and then whether an error code occurs in sampled data corresponding to the first position after each adjustment is determined. If no error code occurs, a DQS position is continually adjusted rightwards in a unit of N step lengths. When an error code occurs at an adjusted position, the DQS position continues to be adjusted leftwards from the current position, for example, is successively adjusted leftwards in a unit of a minimum step length 1, to determine minimum values of all margin effective widths. Specifically, if the DQS position is adjusted to $X_n$, a case in which no error code occurs in the sampled data is changed to a case in which an error code occurs. In this case, it is determined that the left boundary is $X_n+1$.

Specifically, a process of determining the left boundary in the step 202 includes adjusting the initial position rightwards by the step length N to obtain a first position $X_1$, where $X_1=a+N$, determining whether the first position $X_1$ is greater than the preset right boundary b, if $X_1 \leq b$, determining whether there is an error code in sampled data corresponding to the first position $X_1$, if there is no error code, adjusting the first position $X_1$ leftwards by one step length to obtain a third position $X_3$, where $X_3=X_1-1$, if there is an error code, further determining whether $X_1$ can be exactly divided by N, and if $X_1$ can be exactly divided by N, adding one step length N to the current DQ position $X_1$ until the adjusted DQS position is less than or equal to the preset right boundary b, and when there is no error code in data that is read at the adjusted DQS position, performing a step of finely adjusting the DQS position leftwards, when $X_1$ is adjusted leftwards in a case of no error code by one step length to obtain a third position $X_3$, determining whether the third position $X_3$ is greater than or equal to the preset left boundary a, and if $X_3 \geq a$, when the third position $X_3$ cannot be exactly divided by the step length N, determining whether there is an error code in data sampled at the third position $X_3$, and when no error code is detected, performing a process of fine leftward adjustment by gradually subtracting 1, and until it is detected that data at a current position $X_n$ has an error code and cannot be exactly divided by the step length N, determining that the left boundary is a value obtained by adding 1 to the current position $X_n$.

Optionally, in the step of determining whether the first position $X_1$ is greater than the preset right boundary b, if $X_1>b$, it indicates that the adjusted step length N is too large and exceeds the right boundary b of the preset range. In this case, the step length needs to be adjusted again and the controller reports an error.

Step 203. The controller adjusts, using the left boundary as a reference, minimum values of margin effective widths of all DQs to be aligned with the left boundary.

Step 204. The controller determines, using the preset right boundary b as an initial position, whether an error code occurs in data read when the DQS position is the preset right boundary b.

Step 205. If no error code occurs, the controller determines that the right boundary is the preset right boundary b.

If an error code occurs, the controller first adjusts the initial position leftwards by the step length N to obtain a second position, and then adjusts the second position rightwards successively by one step length. Until a position obtained after rightward adjustment has an error code and cannot be exactly divided by the step length N, the controller determines that the right boundary is a position obtained by subtracting 1 from the position obtained after rightward adjustment.

Specifically, a process of determining the right boundary in step 205 includes adjusting the initial position leftwards by the step length N to obtain a second position X2, where X2=X1−N, determining whether the second position X2 is less than the preset left boundary a, if the second position X2 is not less than the preset left boundary a, that is, X2≥a, determining whether an error code occurs in sampled data corresponding to the second position X2, if no error code occurs, adjusting the second position X2 rightwards by one step length to obtain a fourth position X4 (X4=X3+1), determining whether the fourth position X4 is less than or equal to the preset right boundary b, if the fourth position X4 is less than or equal to the preset right boundary b, that is, X4≤b, when the fourth position X4 cannot be exactly divided by the step length N, determining whether an error code occurs in data sampled at the fourth position X4, and when no error code is detected, performing a process of finely adjusting the DQS position rightwards gradually in a unit of a minimum step length 1, and until it is detected that data at a current position Xm has an error code and cannot be exactly divided by the step length N, determining that the right boundary is a position obtained by subtracting 1 from the current position Xm, or if the fourth position is greater than the preset right boundary b, that is, X4>b, using the preset boundary b as the right boundary.

Optionally, if an error code occurs in data read when the DQS is at the second position X2, when the second position X2 can be exactly divided by N, the controller adjusts the DQS position leftwards in a unit of the step length N, to obtain an adjusted DQS position of X2−N, and continues to determine whether the adjusted position is less than the preset left boundary a.

Optionally, in the process of determining whether the second position X2 is less than the preset left boundary a, if X2<a, it indicates that the adjusted step length N is too large and exceeds the preset left boundary a of the preset range. In this case, the step length needs to be adjusted again and the controller reports an error.

According to the method provided in this embodiment, the preset boundary range [a, b] is set, and one end a or b of the preset range is used as a boundary value to adjust another end such that the maximum value and the minimum value of the margin effective width can be rapidly determined, that is, the left boundary and the right boundary are determined, and a central position is calculated based on the left boundary and the right boundary. According to this method, convergence speed is accelerated and adjustment efficiency is improved.

In addition, according to the method provided in this manner, after it is determined that the left boundary is the preset left boundary a, when the right boundary is determined by adjusting the DQS position rightwards, coarse rightward adjustment is first performed based on a large unit step length N, and fine leftward adjustment is then performed based on a minimum unit step length 1 such that beneficial effects of fast convergence and determining the boundary value are implemented.

In addition, it should be noted that, in the manner 1 described in this embodiment, the preset right boundary b may be first used as the initial position of the DQS, and then leftward adjustment is performed to determine the left boundary. A specific adjustment method is similar to steps 201 to 205. Details are not described herein again.

That the left boundary is determined as the preset left boundary a if determining that no error code occurs in the data sampled by the DQS at the initial position in step 202 of the foregoing method includes the following two cases.

Case 1.

When no error code occurs in all eight pieces of data (corresponding to eight DQs) sampled by the DQS when the DQS signal is at the initial position (the preset left boundary a), that is, the preset boundary range [a, b] is between the margin effective widths of all the DQs, in other words, all the minimum values of the margin effective widths of all the DQs are less than or equal to the preset left boundary a, it is determined that the left boundary is the preset left boundary a.

Case 2.

When an error code occurs in one or more of eight pieces of data (corresponding to eight DQs) sampled by the DQS when the DQS signal is at the initial position (or the preset left boundary a), that is, minimum values of margin effective widths of one or more DQs are greater than the preset left boundary a, the last DQ in which an error code occurs needs to be determined from DQs in which an error code occurs, and a minimum value of a margin effective width of the DQ is used as the left boundary. In addition, minimum values of all remaining margin effective widths are adjusted rightwards to a position that is aligned with the last DQ in which an error code occurs, namely, a process of De-skew.

In a specific embodiment, a process of determining a value of a left boundary and a value of a right boundary of an effective margin width of a target DQ in the manner 1 and a process of determining a center of a first position based on the left boundary and the right boundary are described in detail. Details are described below.

For example, for a bus rate of 400 Mbps, (1) it is assumed that a preset boundary range of a margin effective width is [a, b], where a indicates a preset left boundary, and b indicates a preset right boundary, and (2) it is assumed that a value of the step length N is 16 (a scale for coarse adjustment), where N is a natural number greater than 1.

Optionally, to determine a central position through fast convergence, boundary values of the preset boundary range are set to an integral multiple of N, that is, the preset range [48, 272] is [3N, 17N] for the step length N respectively.

The controller uses the preset left boundary a as an initial position, and determines whether an error code occurs in data sampled by a DQS that is at the initial position.

Figure 13:
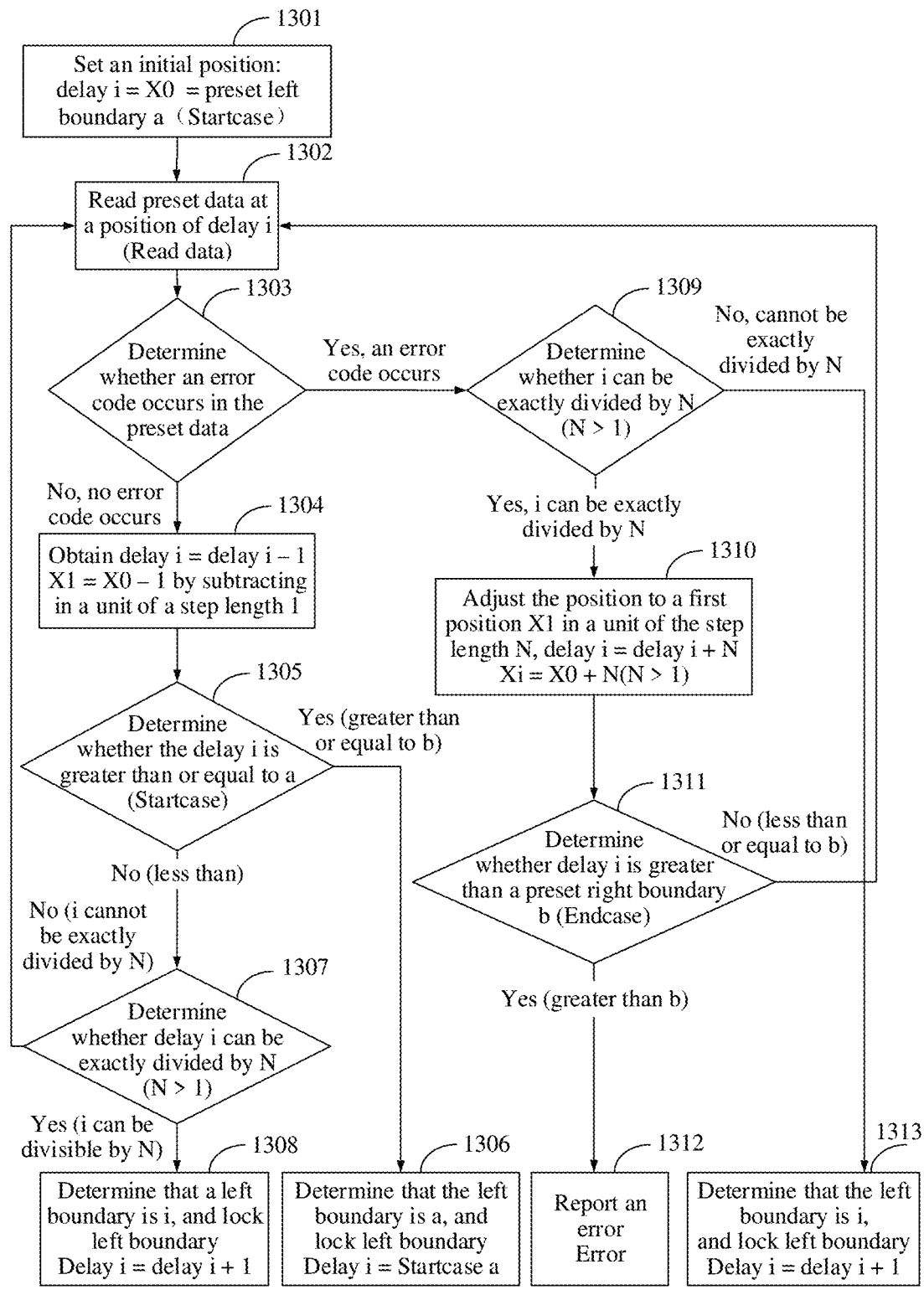
FIG. 13 is a schematic flowchart of determining a value of a left boundary in a read direction according to this disclosure.

As shown in FIG. 13, step 1301. The controller sets an initial position i, for example, i=startcase=preset left boundary a=48.

Step 1302. The controller reads sampled data that is at the initial position i, where the sampled data includes a total of eight pieces of data respectively corresponding to a total of eight lines of a DQ 0 to a DQ 7.

Step 1303. The controller detects whether an error code occurs in data obtained when the initial position i is 48. If there is no error code, it is yes, and step 1304 is performed. If there is an error code, it is no, and step 1309 is performed. Assuming that there is no error code in this detection, step 1304 is performed.

The detecting that an error code occurs in the data at the initial position i can be understood as that a setup time corresponding to the detected DQS position is less than the preset setup time.

Step 1304. The controller adjusts the initial position leftwards in a unit of a minimum step length 1 to a delay i, where i=i−1=48−1=47.

Step 1305. The controller determines whether the currently adjusted position i=47 is less than the preset left boundary a.

Step 1306. If 47<48 (Startcase), the controller determines that the left boundary is the preset left boundary a, that is, the left boundary is 48.

Optionally, if an error code occurs at the preset boundary value i that is 48 in the determining in step 1303, step 1309 is performed. The controller determines whether i that is 48 can be exactly divided by the step length 16, if i that is 48 can be exactly divided by N, step 1310 is performed. In this example, the preset left boundary is used as the initial position and is an integral multiple of N such that the preset left boundary can be exactly divided by N, a remainder is 0, and step 1310 is performed.

Step 1310. When X1 that is 48 can be exactly divided by N and a remainder is 0, the controller performs coarse rightward adjustment in a unit of the step length N, where N=16, to obtain a first position X1=delay i+N=48+16=64 (scale value).

Step 1311. The controller determines whether X1 that is 64 is greater than a preset right boundary b (Endcase=272), and if X1 that is 64 is not greater than the preset right boundary b (that is, X1≤b), step 1302 in which the controller reads preset data at the position X1 is performed, and detects whether an error code occurs in preset data that is at the position, or if X1 that is 64 is greater than the preset right boundary b (X1>b), it indicates that the adjusted DQS position is beyond the right boundary of a preset range, that is, the step length N for coarse adjustment is too large. For example, if the step length N for coarse adjustment is 230, X0+N=48+230=278>272, the controller will report an error (step 1312). In this case, the controller needs to adjust the step length N.

In this embodiment, i+N=64<272 (preset right boundary b), and therefore, step 1302 is performed.

Step 1302. The controller reads data corresponding to 64.

Step 1303. The controller determines whether an error code occurs in the data corresponding to 64. If there is no error code, step 1304 is performed, to continue to adjust a scale value of the DQS leftwards in a unit of 1, or if there is an error code, step 1309 is performed. In this case, assuming that there is no error code, step 1304 is performed.

In this case, it indicates that the range of the left boundary is between 48 and 64, and the process of step 1302 to step 1307 is cyclically performed until an error code occurs in data corresponding to a scale value of a position. For example, assuming that an error code occurs when a position i of the DQS is reduced to 51, and the position i cannot be exactly divided by N, as shown in FIG. 13, it is determined that no error code occurs in corresponding data when the scale value of the current position DQS is added by 1, that is, 51+1=52, in other words, it is determined that the left boundary is obtained by adding 1 to a scale value Xn of the DQS at the current position, as shown in FIG. 12A (L-boundary delay i=delay i+1). In this example, the left boundary is 52.

A specific process is as follows.

Step 1303. If no error code occurs when the controller detects that the current position X1 of the DQS is that X1=48+16=64, the controller performs step 1304.

Step 1304. The controller adjusts a current position of the DQS to 64−1=63.

Step 1305. The controller determines whether 63 is less than the preset boundary value 48, and if 63 is not less than the preset boundary value 48, the controller performs step 1307.

Step 1307. The controller determines whether 63 can be exactly divided by 16, and if 63 cannot be exactly divided by 16, the controller performs step 1302.

Step 1302. The controller performs step 1302.

Step 1303. The controller detects whether an error code occurs at 63, and if no error code occurs, the controller performs step 1304.

Step 1304. The controller adjusts a current position of the DQS to 63−1=62.

By analogy, the process is cyclically performed until the current position of the DQS is adjusted to 51.

Step 1303. If the controller determines that an error code occurs for the scale value 51 of the position i, the controller performs step 1309.

Step 1309. The controller determines whether 51 can be exactly divided by 16 and the remainder is 0, and if 51 cannot be exactly divided by 16, the controller performs step 1313.

Step 1313. The controller determines that the left boundary is 51+1=52.

The process ends.

Optionally, in the foregoing method, when step 1302 to step 1307 are cyclically performed, if the DQS position is adjusted to 49, there is no error code in data sampled when i=49, and the DQS position is further adjusted to 48 (step 1304). In this case, if i that is 48 is equal to the preset left boundary a, step 1307 is performed to determine whether i can be exactly divided by the step length 16, and if i can be exactly divided by the step length 16, step 1308 is performed to determine that the left boundary is 48+1=49.

Optionally, in step 1303, when the controller determines whether an error code occurs in preset data read when the scale value is 64, if an error code occurs, 64 can be exactly divided by N, and then the step length N is added to obtain a current position of the DQS is 64+16=80. Then the determining step of step 1311 is performed. When the current position of the DQS is 80 that is less than 272 (preset right boundary b), step 1302 is performed, and steps 1303 to 1307 are cyclically performed, or the method procedure of step 1303 to step 1311 is cyclically performed.

In conclusion, in the process of adjusting the DQS position to determine the left boundary, the boundary range [a, b] is preset. If the scale value of the DQS increased in a unit of the step length N exceeds the preset right boundary b, the step length N is decreased to re-determine the left boundary. If the scale value of the currently adjusted DQS is less than the preset left boundary a, the preset left boundary a is used as the left boundary. If the currently adjusted DQS is located in the preset range from a to b, the preset boundary range and whether there is an error code may be used to determine that the current position of the DQS is the left boundary such that automatic adjustment of a DL of the DQS signal is implemented, and adjustment efficiency is improved.

After the left boundary of the margin effective width of the target DQ is determined, the method further includes aligning left end points of the margin effective widths of all the DQs, that is, adjusting DLs of all the DQs such that the left boundary of the DQ signals is aligned with the edge of the DQS signal (De-skew).

Figure 14:
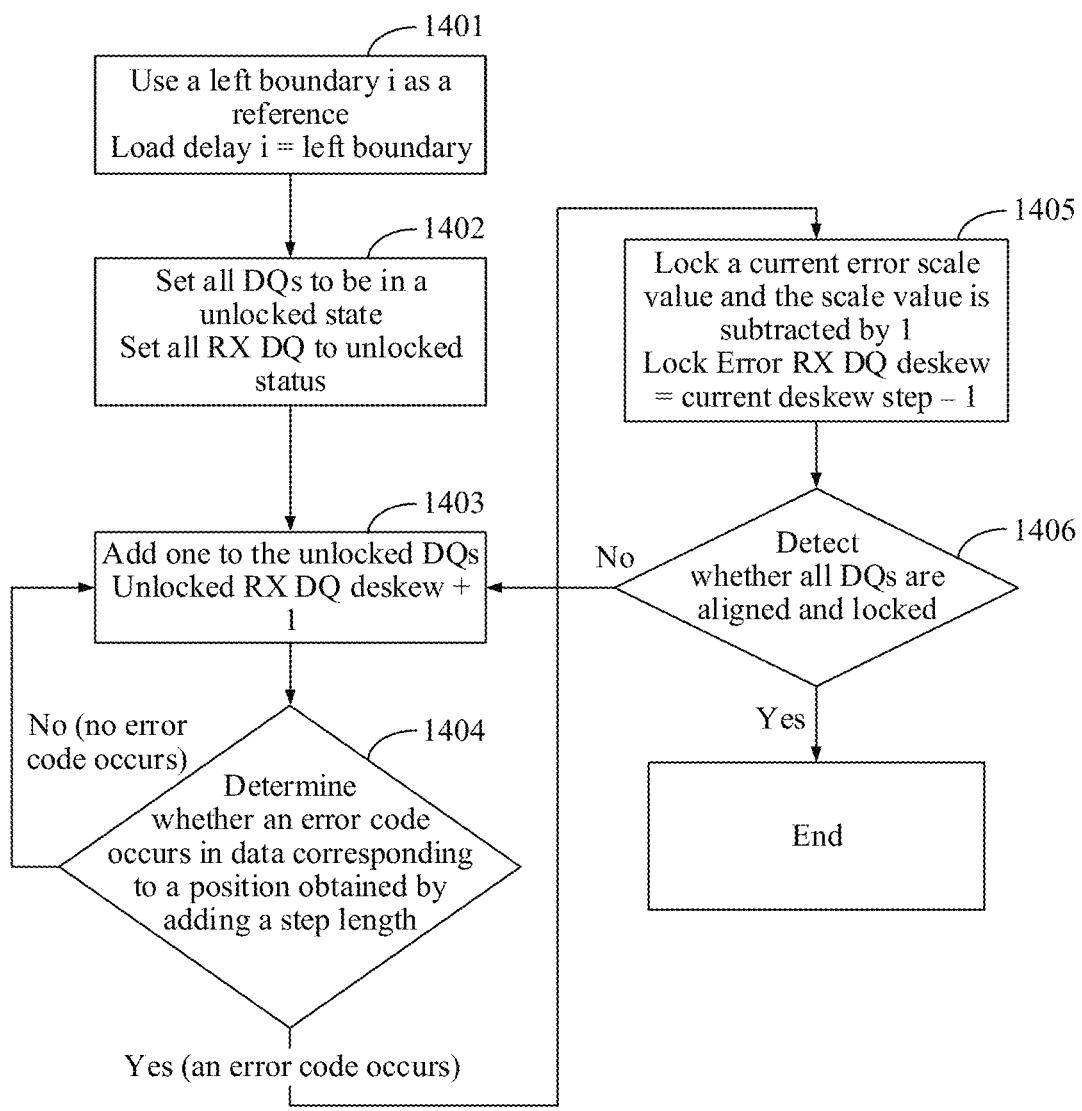
FIG. 14 is a schematic flowchart of left alignment training in a read direction according to this disclosure.

A specific implementation is shown in FIG. 14, and the following specific steps are included.

Step 1401. The controller determines a left boundary and adjusts a DL of a DQ signal using the left boundary as a reference, where a scale value of the left boundary is usually represented by i.

Step 1402. The controller sets margin effective widths of all DQ signals to be in an unlocked state.

Step 1403. A left end point of the margin effective width of each DQ signal is increased in a unit scale of a step length 1, that is, the margin effective widths of all DQs are adjusted rightwards.

Step 1404. The controller obtains a minimum value of the margin effective width of each adjusted DQ, and determines whether an error code occurs in data corresponding to each minimum value. If no error code occurs, the controller performs step 1403, one unit step length is further added and whether an error code occurs in the corresponding data is detected again. If no error code occurs, the controller continues to perform rightward adjustment in a unit of one step length until a position at which an error code occurs is detected, and the controller performs step 1404.

Step 1405. If yes, that is, it is detected that an error code occurs in the data, the scale value of the current position is subtracted by one unit step length, and is set to be in a locked state. This indicates that a position that is obtained by subtracting 1 from a minimum value of a margin effective width of a current DQ is aligned with the edge of the DQS.

Step 1406. The controller detects whether all the minimum values of the margin effective widths of all the DQs have been aligned with the edge of the DQS. If all the minimum values of the margin effective widths of all the DQs have been aligned with the edge of the DQS, the process ends, or if not all the minimum values of the margin effective widths of all the DQs are aligned with the edge of the DQS, the controller performs step 1403, and a scale value of the minimum value continues to be increased until all the minimum values of all the DQ signals are the same as the scale value corresponding to the left boundary.

Figure 15:
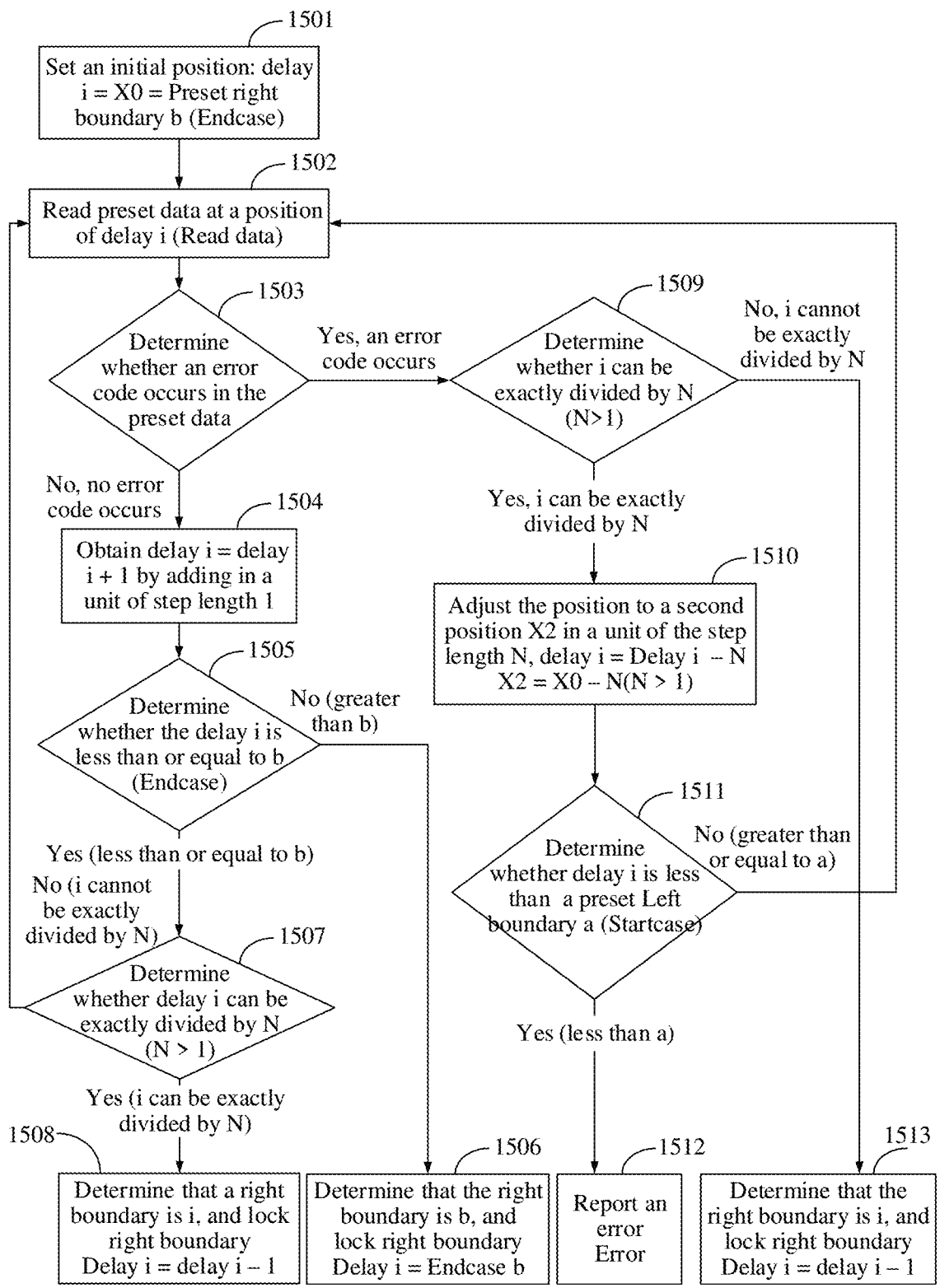
FIG. 15 is a schematic flowchart of determining a value of a right boundary in a read direction according to this disclosure.

After the margin effective widths of all the DQs are left aligned, the controller needs to determine a right boundary. A specific implementation process is shown in FIG. 15, and the following steps are included.

The controller sets a preset range [a, b], where a is a preset left boundary a (startcase), and b is a preset right boundary (endcase).

Step 1501. The controller sets a scale value corresponding to a DQS position to i, where i=preset right boundary b (endcase). The preset right boundary b may be set based on different rates, for example, the preset right boundary b is 272 at a rate of 400 Mbps.

Step 1502. The controller reads preset data written when the DQS position is located at the preset right boundary b.

Step 1503. The controller determines whether an error code occurs in the preset data written when the DQS position is located at the preset right boundary b. If there is no error code, the controller performs step 1504, or if there is an error code, the controller performs step 1509.

When there is no error code occurs in the preset data, it is determined that the right boundary is the preset right boundary b, or step 1504 is performed.

Step 1504. The controller adjusts the DQS position rightwards in a unit of the step length 1, that is, delay i=i+1=272+1=273.

Step 1505. The controller determines whether the delay i is greater than the preset right boundary b.

Step 1508. If delay i=273>272 (preset right boundary b), it is determined that the right boundary is a preset right boundary b, where b=272.

In addition, in step 1503, if it is detected that an error code occurs in preset data written when the DQS position i is 272, step 1509 is performed.

Step 1509. The controller detects whether the DQS position i that is 272 can be exactly divided by N without a remainder. Because the preset right boundary b is an integral multiple of N, the DQS position i=272 can be exactly divided by N, and step 1510 is performed.

Step 1510. Coarse leftward adjustment is performed in a unit of the step length N, to reduce a scale value of the DQS, to obtain a second position X2, where X2=delay i−N=272−16=256, and this process is a coarse adjustment process.

Step 1511. The controller determines whether the second position delay i−N=256 is less than a preset left boundary a, where a=48 (startcase), and if i−N<a, the controller performs step 1512.

Step 1512. When i−N<a, it indicates that the step length N used for adjustment in step 1510 is too large and exceeds the preset left boundary a of the preset range. In this case, the step length needs to be adjusted, and the controller reports an error.

If delay i−N≥a, step 1502 is performed. In this embodiment, if 256≥48, step 1502 is performed.

Step 1502. The controller reads preset data written when the second position X2=delay i−N=256.

Step 1503. The controller determines whether an error code occurs in the preset data written at the second position X2=256.

Step 1504. If there is no error code, the controller finely adjusts the DQS position rightwards in a unit of the step length 1, that is, delay 256+1=257, indicating that a range of the right boundary is between [256, 272].

Step 1505. The controller determines whether the scale value 257 of the currently adjusted DQS position is greater than a preset right boundary b (Endcase). If the scale value is greater than b, step 1506 is performed, or if the scale value is less than or equal to b, step 1507 is performed. In this example, 257<272, and therefore, step 1507 is performed.

Step 1507. The controller determines whether the current DQS position 257 can be exactly divided by N, where N=16. If the current DQS position 257 cannot be exactly divided by 16, the controller performs step 1502, and the controller continues to read and detect whether an error code occurs in preset data written at the adjusted position. When it is determined that there is no error code, steps 1504 to 1507 are cyclically performed by gradually increasing the scale value of the DQS by a minimum step length 1.

In this example, the position 257 detected in step 1507 cannot be exactly divided by 16, and therefore, step 1502 is performed.

Step 1503. Steps 1502 to 1506 are cyclically performed by gradually increasing the scale value of the DQS by the step length 1, to implement fine rightward adjustment. Until it is detected that an error code occurs in data corresponding to a position in step 1503, the right boundary may be determined.

For example, when an error code occurs when a DQS position is adjusted to 261, step 1509 of determining whether 261 can be exactly divided by N is performed.

Figure 12B:
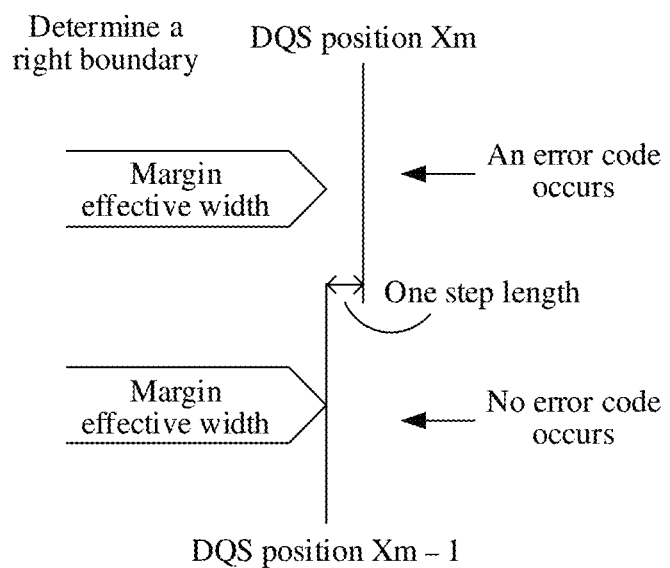
FIG. 12B is a schematic diagram of determining a value of a right boundary according to this disclosure.

If 261 cannot be exactly divided by N, step 1513 of determining that the right boundary is a position Xm−1, that is, 261−1=260, at which an error code occurs in data and that cannot be exactly divided by the step length N is performed. In this case, when the DQS position is 260, no error code occurs in corresponding sampled data, that is, the right boundary is 260, as shown in FIG. 12B.

In addition, in the determining process in step 1503, if an error code occurs in the preset data written when the second position X2 is 256, step 1509 and step 1510 of further adjusting the DQS position leftwards by N scale values are performed to obtain a DQS position 256−16=240. In this case, the DQS position delay i is delay 240. Then step 1511 and step 1502 are performed. Until no error code occurs in data written at the obtained delay i, a coarse adjustment process ends, and then steps 1504 to 1507 are performed to finely adjust the DQS position rightwards.

The process ends.

In the process of determining the right boundary, the controller can coarsely adjust the DQS position leftwards in a larger unit of the step length N, and can also finely adjust the DQS position in a smaller unit of the step length 1 such that beneficial effects of automatically adjusting the DQS and determining the right boundary are implemented.

In addition, by setting the boundary range, the right boundary can be rapidly determined such that convergence efficiency is further improved.

After the controller calculates an average value based on the left boundary and the right boundary to obtain the first central position, the method further includes saving and recording, by the controller, the first central position such that the DQS is directly adjusted to the first central position when the DQS is triggered next time, to ensure that the margin effective widths of all the sampled DQs are maximized, that is, the setup time and the hold time have sufficient margins, thereby avoiding an error code and a loss during data reading.

Manner 2.

Figure 16:
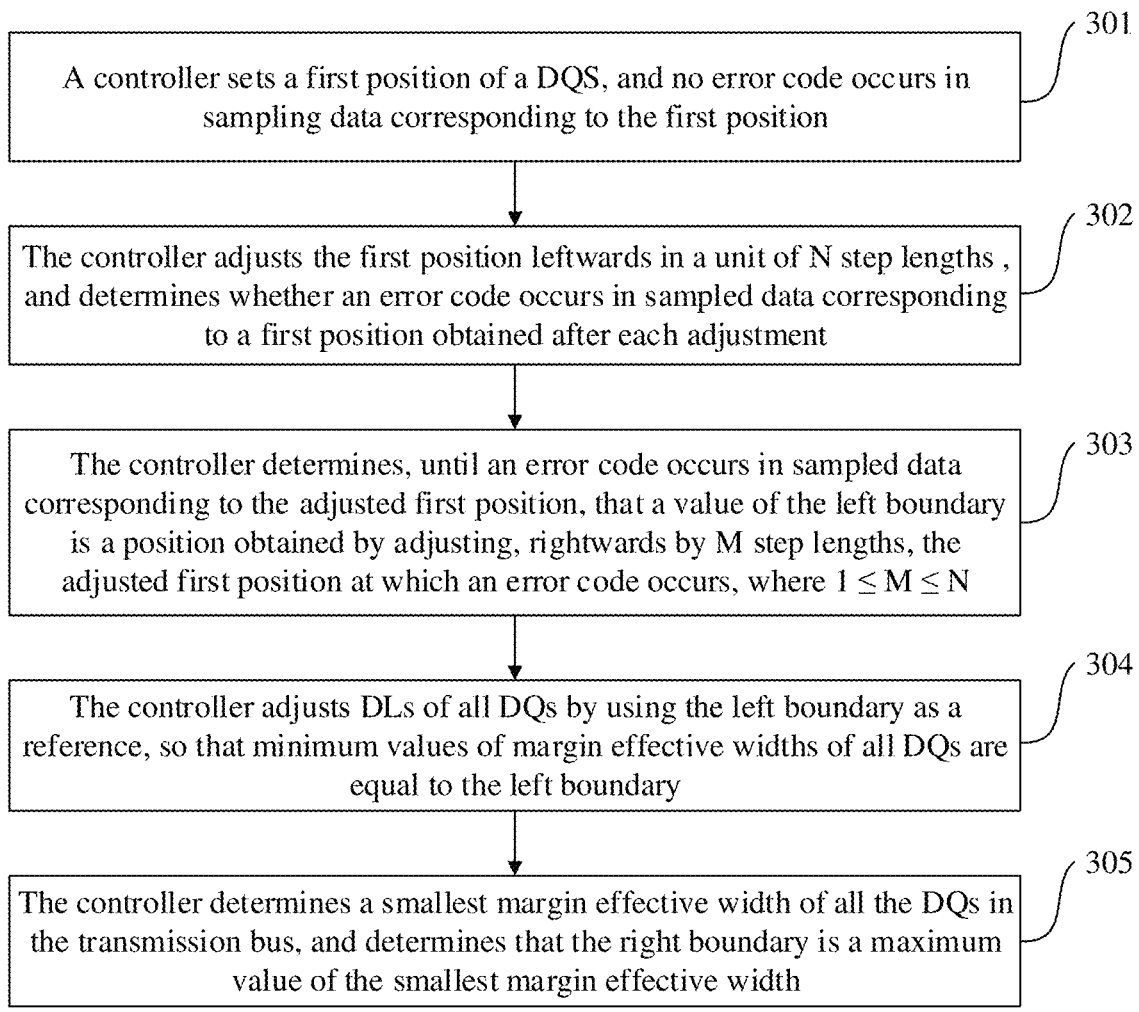
FIG. 16 is a flowchart of determining a value of a left boundary and a value of a right boundary in a second manner according to this disclosure.

As shown in FIG. 16, a process of determining a left boundary and a right boundary by adjusting a DQS position leftwards and rightwards using ¼ of a DQS cycle as a start position includes the following steps.

Step 301. A controller sets a first position of a DQS, where no error code occurs in sampled data corresponding to the first position.

The first position of the DQS is a position obtained after a time delay of ¼ of a DQS cycle starting from an initial moment. Because the DQS signal is double-edge sampled, a relative position center of an effective width of one DQ signal is ¼ of a DQS cycle (¼T Delay).

In addition, optionally, another value of the DQS cycle may also be set as the initial position. This is not limited in this disclosure.

Step 302. The controller adjusts the first position leftwards in a unit of N step lengths, and determines whether an error code occurs in sampled data corresponding to a first position obtained after each adjustment.

Step 303. The controller determines, until an error code occurs in sampled data corresponding to the adjusted first position, that the left boundary is a position obtained by adjusting, rightwards by M step lengths, the adjusted first position at which an error code occurs, where 1≤M≤N.

Specifically, the DQS may be gradually adjusted leftwards from the first position by a scale value, until a first DQ, of all DQs, in which an error code occurs is obtained, and a position obtained by adjusting, rightwards by adding one step length, a minimum value of a margin effective width of the first DQ in which an error code occurs is used as the left boundary. As shown in FIG. 12A, the minimum value of the margin effective width of the first DQ in which an error code occurs is Xn. If Xn is adjusted based on the minimum step unit 1, the left boundary is Xn+1.

Step 304. The controller adjusts DLs of all the DQs using the left boundary as a reference such that minimum values of margin effective widths of all the DQs are equal to the left boundary.

For a specific process of left alignment, refer to the process of step 1401 to step 1406 in the foregoing embodiment, as shown in FIG. 14. Details are not described in this embodiment.

Step 305. The controller determines the smallest margin effective width of all the DQs in the transmission bus, and determines that the right boundary is a maximum value of the smallest margin effective width.

Specifically, the controller scans the margin effective widths of all the DQs rightwards from the left boundary to determine a DQ having a smallest margin effective width, and uses a maximum value of the DQ having the smallest margin effective width as the right boundary.

Figure 17:
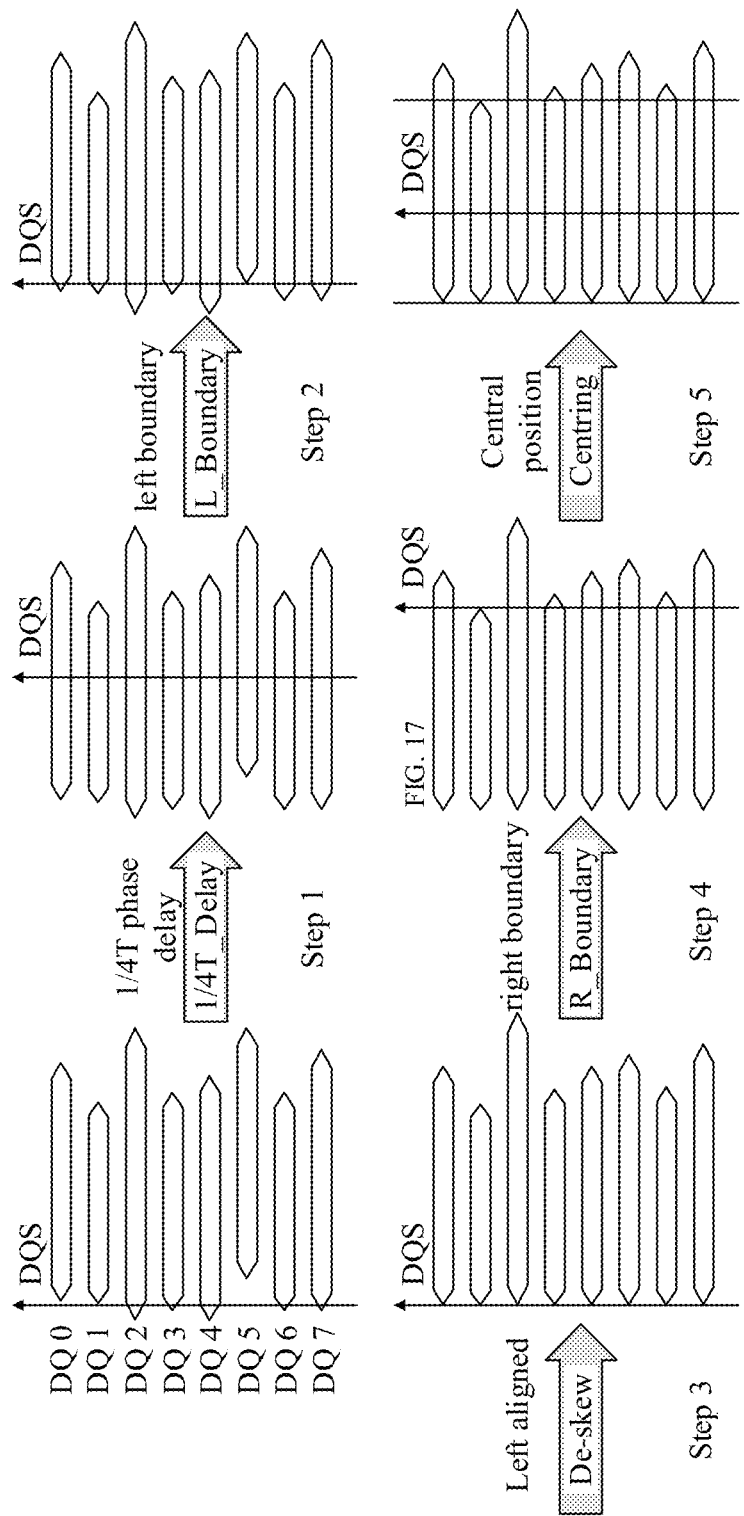
FIG. 17 is a schematic diagram of a method for training a timing margin in a read direction according to this disclosure.

FIG. 17 is a schematic flowchart of determining a value of a left boundary and a value of a right boundary in a second manner according to this embodiment. The process may include the following steps.

Step 1. The controller sets an initial position i of a DQS to ¼ of a DQS cycle, for example, a ¼ position of 1024 scale values corresponding to the DQS cycle. The initial position i is located at a relative central position of the margin effective widths of all the DQ signals.

The DQS cycle may be obtained through DLL measurement and sent to a controller.

Step 2. The controller adjusts the DQS position leftwards using the initial position i as a start point, and determines that the first DQ in which an error code occurs is the left boundary. For the specific process of determining the left boundary, refer to FIG. 13 and steps 1301 to 1313 in the foregoing embodiment. Details are not described.

In this example, it is determined that the left boundary is a minimum value of a margin effective width of a DQ 5.

Step 3. The controller adjusts, using the left boundary as a reference, DLs (namely, minimum values) of all remaining DQs to be aligned with the left boundary.

Step 4. The controller scans the margin effective widths of all the DQs rightwards from the left boundary, determines a DQ having a smallest margin effective width, and uses a maximum value of the DQ having the smallest margin effective width as the right boundary.

In this example, when left alignment is implemented, if the DQ having the smallest margin effective width is a DQ 1, it is determined that a maximum value of the margin effective width of DQ 1 is the right boundary.

Step 5. The controller calculates a central position based on the left boundary and right boundary, and aligns margin effective width centers of all the remaining DQs. For example, it is determined that a center of the margin effective width of the DQ 1 is a first central position, a DL length corresponding to the first central position is data that needs to be registered by the controller, and the data is stored in a corresponding DQS register.

In addition, in the process of left alignment in step 3, the controller also records DLs used to adjust the remaining DQs to the left boundary, and stores these DLs in corresponding DQ registers.

In this embodiment, the left and right boundaries are determined through adjustment using ¼ of the DQS cycle as the initial position, and the left and right boundaries can be found relatively quickly in comparison with a manner in which adjustment is performed starting from an initial left end point value of a DS signal and the first central position is determined such that adjustment efficiency is improved.

Manner 3.

A process of determining a left boundary and a right boundary of a DQS in this manner is similar to that in the first manner. A difference lies in that, the controller gradually increases a scale value of the DQS from an initial scale value of 0, performs scanning until a minimum value of a margin effective width of a last DQ in which an error code occurs is obtained, and uses the minimum value as the left boundary, then all DQs are left aligned and the DQS position is gradually adjusted rightwards to determine the right boundary, and finally centers of margin effective widths of all the DQs are aligned.

Figure 18:
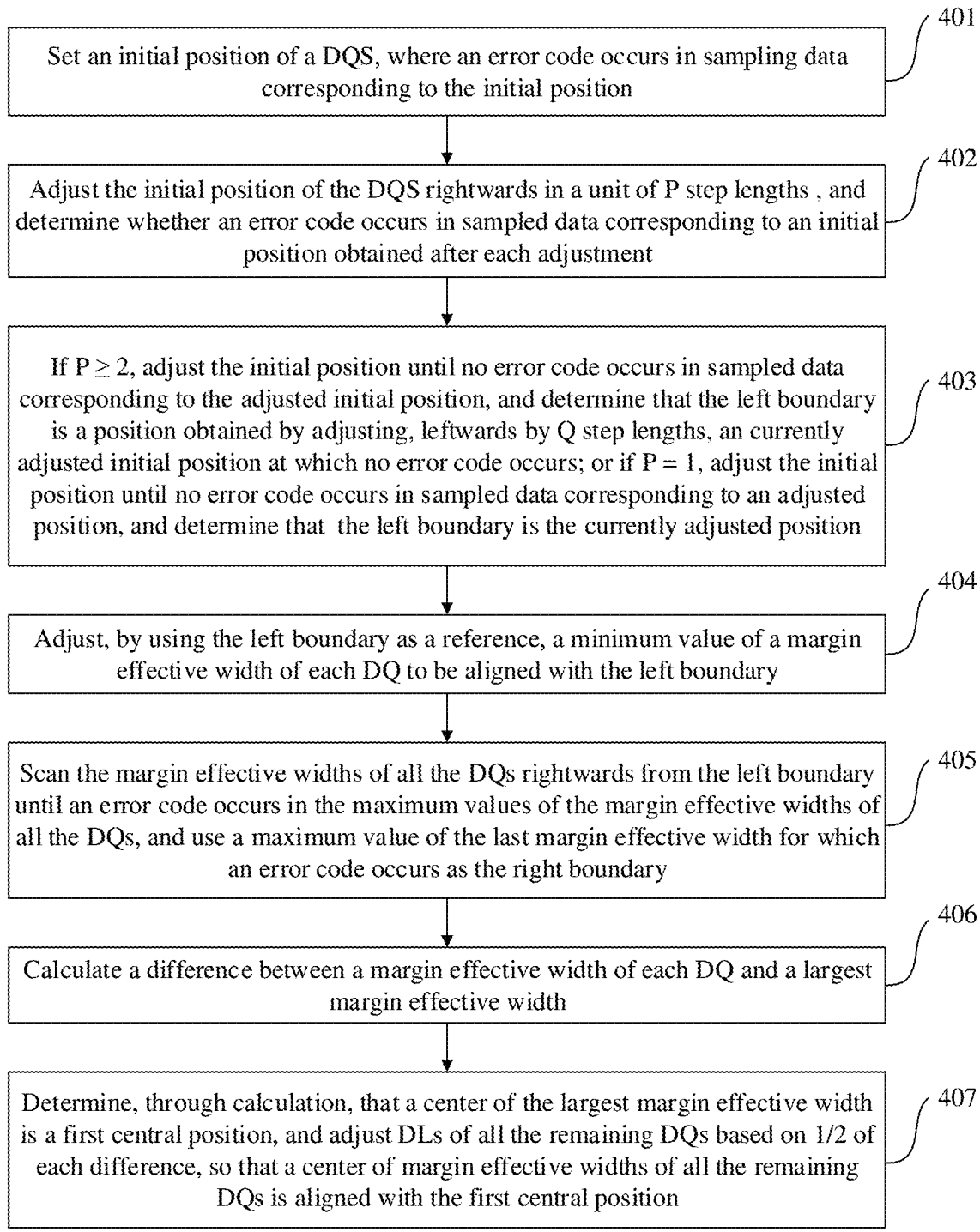
FIG. 18 is a flowchart of determining a value of a left boundary and a value of a right boundary in a third manner according to this disclosure.

As shown in FIG. 18, further, the method includes the following steps.

Step 401. A controller sets an initial position of a DQS, where an error code occurs in sampled data corresponding to the initial position.

Optionally, the initial position is an initial scale value 0.

Step 402. The controller adjusts the initial position of the DQS rightwards in a unit of P step lengths, and determines whether an error code occurs in sampled data corresponding to an initial position obtained after each adjustment.

Step 403. If P≥2, the controller adjusts the initial position until no error code occurs in sampled data corresponding to the adjusted initial position, and determines that the left boundary is a position obtained by adjusting, leftwards by Q step lengths, a currently adjusted initial position at which no error code occurs, where 1≤Q≤P.

Alternatively, if P=1, the controller adjusts the initial position until no error code occurs in sampled data corresponding to an adjusted position, and determines that the left boundary is the currently adjusted position.

Step 404. The controller adjusts, using the left boundary as a reference, a minimum value of a margin effective width of each DQ to be aligned with the left boundary.

Step 405. The controller scans rightwards the margin effective widths of all the DQs from the left boundary until an error code occurs in the maximum values of the margin effective widths of all the DQs, and uses a maximum value of the last margin effective width for which an error code occurs as the right boundary.

Step 406. The controller calculates a difference between a margin effective width of each remaining DQ and a largest margin effective width.

Step 407. The controller determines, through calculation, that a center of the largest margin effective width is a first central position, and adjusts DLs of all the remaining DQs based on ½ of each difference such that a center of the margin effective widths of all the remaining DQs are aligned with the first central position, that is, a center of the margin effective widths of all the DQ is aligned with a DQS position.

Figure 19:
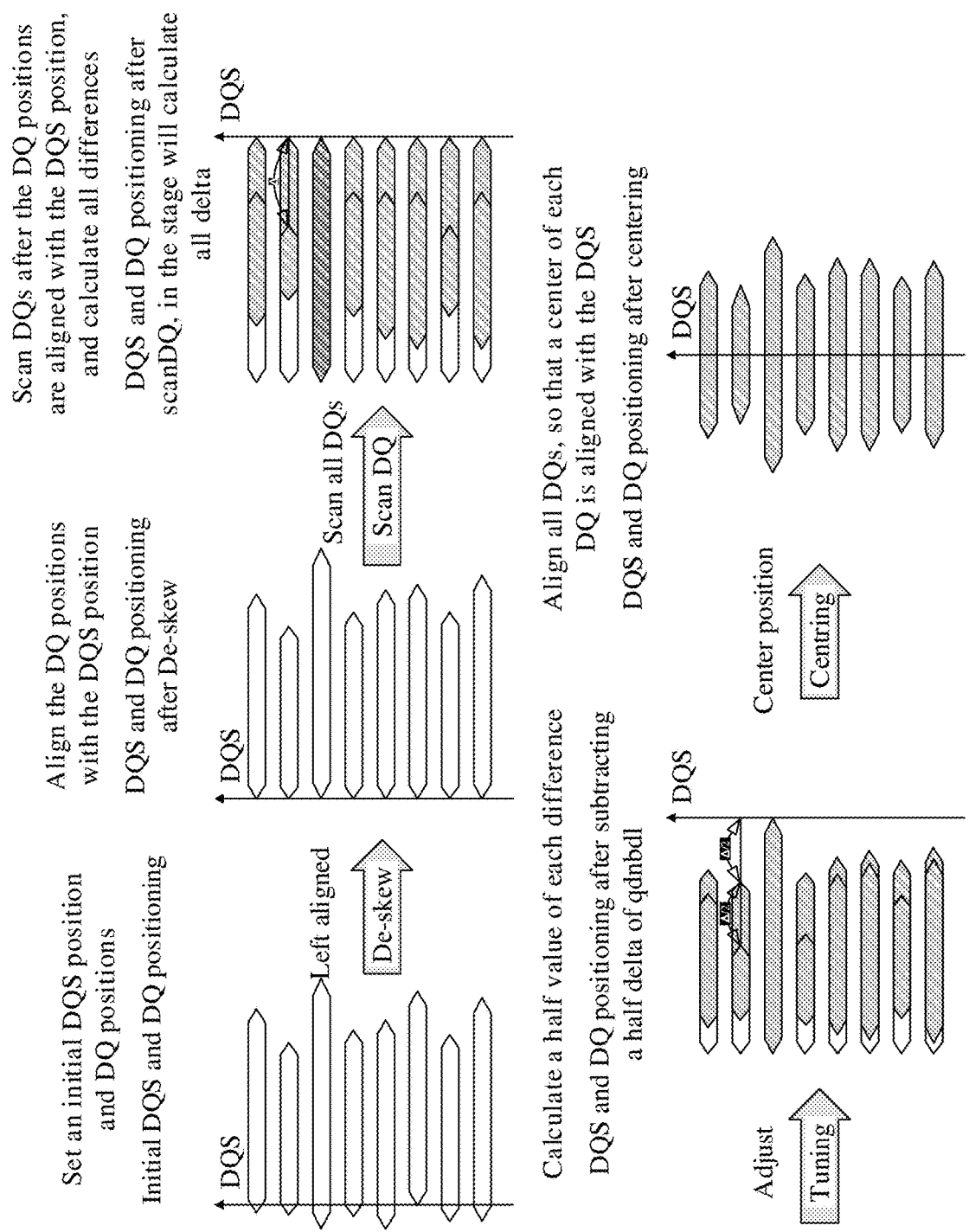
FIG. 19 is a schematic diagram of another method for training a timing margin in a read direction according to this disclosure.

Specifically, as shown in FIG. 19, the method includes gradually adjusting, by the controller, the DQS position rightwards from an initial scale value, where an error code occurs in data detected at the initial scale value, and adjusting the DQS position in a unit of the step length P, where P is set to 1, and no error code occurs gradually in data correspondingly detected. When no error code occurs in the last DQ, it is determined that a position of the current DQS is the left boundary, namely, a largest value in margin effective widths of all the DQs.

Then the controller adjusts rightwards minimum values of margin effective widths of remaining seven DQs such that all the minimum values are aligned with the determined left boundary. In this case, the DQS position is aligned with the minimum values of margin effective widths of the eight DQs. The controller scans the margin effective width of each DQ to determine a DQ having the longest margin effective width (namely, the last DQ in which an error code occurs). In this example, the DQ having the longest margin effective width is a DQ 2, and a difference (A) between a margin effective width of each remaining DQ and a margin effective width of the DQ 2 is calculated. For example, if it is obtained, through calculation, that a difference between a margin effective width of a DQ 1 and the margin effective width of the DQ 2 is A, the controller needs to adjust the DQ 1 by a length of Δ/2 relative to the center of the margin effective width of the DQ 2. That is, a DL of the DQ 1 is adjusted rightwards by a scale value of Δ/2 such that the center point of the DQ 1 is aligned with the center point of the DQ 2.

Similarly, positions of all other DQs are adjusted correspondingly based on a difference between the positions of all the other DQs and a center position of the DQ 3 such that centers of the margin effective widths of all the DQs are aligned with the center of DQ 2, and the position at which all centers are aligned is the first central position, namely, an optimal position at which the DQS samples the DQ signals.

According to the method of aligning a DQ with the DQS provided in this embodiment, the centers of all the DQs are aligned with the edge of the DQS. In this case, a center of a margin effective width of any DQ is the first central position.

It should be noted that, in addition to the three manners provided in this embodiment, another manner may also be used to adjust the DQS, determine the left and right boundaries, and adjust the center of the margin effective width of the DQ to be aligned with the edge of the DQS. Other manners such as variation and a combination of the three manners are not limited in this disclosure.

In the manner 3, the centers of the margin effective widths of all the DQs can be aligned using calculated differences between the margin effective widths of the DQs such that the edge of the DQS at the receive end is located at an optimal sampling position of all the DQ signals, a margin of the setup time and a margin of the hold time of the signal at the receive end are maximized, and therefore, high reliability of data read and write operations is ensured.

In the flowchart shown in FIG. 7, after completing read direction timing margin training, the controller performs step ③. The controller performs write direction timing margin training on data to obtain the second central position. A process of step ③ is similar to the process of timing training in the read direction in step ②. The controller may directly set the initial position of the DQS to the value of the preset left boundary or the value of the preset right boundary, and adjust the DQS position using the initial position as a reference, to determine the left and right boundaries of a target margin effective width in the write direction.

In addition, the controller may further determine the second central position in the manner 2 and the manner 3. Optionally, when determining the left and right boundaries in the manner 2, the controller may gradually adjust the DQS position directly from an initial scale value 0, or determine the left boundary and the right boundary and calculate the second central position based on the method processes shown in FIG. 13 to FIG. 15 corresponding to the foregoing embodiments. The second central position is an average value of the left boundary and the right boundary. A specific process is not described in detail in this embodiment.

When the second central position is obtained through calculation, target margin effective widths used for determining the first central position and the second central position are different because the receive end and the transmit end have different interference environments, that is, target DQs may also be different, but a common condition needs to be met. A left boundary and a right boundary of a smallest margin effective width of a DQ are used as necessary conditions for calculating a central position.

The methods provided in the foregoing embodiments include the following beneficial effects.

First, the controller customizes training data, and at a power-on moment, the controller writes the custom data into the register of the NAND flash at a low rate to ensure accuracy of write data before timing training.

Second, the controller reads the custom data written at low speed in the previous step, performs the timing training in the read direction, automatically adjusts the DL of the DQ signal on a controller side, to maximize the effective widths of all the DQ signals, and automatically adjusts the DL of the DQS signal on the controller side such that the edge of the DQS signal is located at the optimal sampling point of the DQ signal.

Third, the controller writes the custom data at a normal rate, then sends a read command to read the data that is just written, and performs timing training in the write direction. The controller automatically adjusts the DL of the DQ signal on the controller side to maximize the effective widths of all the DQ signals at the receive end of the NAND flash. In addition, the controller automatically adjusts the DL of the DQS on the controller side such that the edge of the DQS signal at the receive end of the NAND flash is located at the optimal sampling point of the DQ signal, and therefore, an error code is avoided during data reading and writing, and reliability of data read and write operations is improved.

In addition, according to the method, optimization precision and efficiency of a sampling point can be further greatly improved, to ensure that a transmission link can work reliably in different states such as process corners, voltages, and temperatures, and a higher transmission rate is supported.

Figure 20:
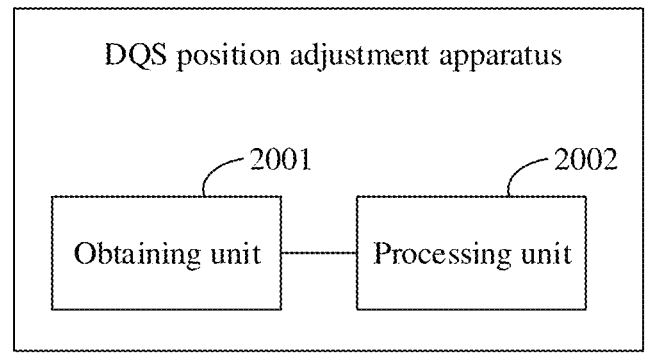
FIG. 20 is a schematic structural diagram of a DQS position adjustment apparatus according to this disclosure.

FIG. 20 is a schematic structural diagram of a DQS position adjustment apparatus according to an embodiment of this disclosure. The apparatus includes an obtaining unit 2001 and a processing unit 2002. In addition, the apparatus may further include other functional units such as a sending unit and a storage unit.

The obtaining unit 2001 is configured to obtain margin effective widths of all DQs in a transmission bus. The margin effective width is a signal width in which preset data is correctly sampled by a receive end after the preset data is transmitted to the receive end in an ideal signal width at a transmit end.

The processing unit 2002 is configured to determine a left boundary and a right boundary based on the margin effective widths, where the left boundary is a largest value in minimum values of the margin effective widths of all the DQs, and the right boundary is a smallest value in maximum values of the corresponding margin effective widths when all the DQs are aligned with the left boundary, calculate a first central position based on the left boundary and the right boundary, where the first central position is a center of a smallest margin effective width obtained after all the DQs are aligned during read data training, and adjust a DL of the DQS to the first central position.

Optionally, in a specific implementation of this embodiment, the processing unit 2002 is further configured to set a first position X1 of the DQS, where no error code occurs in sampled data corresponding to the first position X1, adjust the first position X1 leftwards in a unit of N step lengths, and determine whether an error code occurs in sampled data corresponding to a first position X1 obtained after each adjustment, and determine, until an error code occurs in sampled data corresponding to the adjusted first position X1, that the left boundary is a position obtained by adjusting, rightwards by M step lengths, the adjusted first position X1 at which an error code occurs, where $1 \leq M \leq N$.

Optionally, in another specific implementation of this embodiment, the processing unit 2002 is further configured to set a second position X2 of the DQS, where an error code occurs in sampled data corresponding to the second position X2, and adjust the second position X2 rightwards in a unit of P step lengths, and determine whether an error code occurs in sampled data corresponding to a second position X2 obtained after each adjustment, and if $P \geq 2$, adjust the second position X2 until no error code occurs in sampled data corresponding to the adjusted second position X2, and determine that the left boundary is a position obtained by adjusting, leftwards by Q step lengths, a currently adjusted second position X2 at which no error code occurs, where $1 \leq Q \leq P$, or if P=1, adjust the second position X2 until no error code occurs in sampled data corresponding to the adjusted position, and determine that the left boundary is the currently adjusted position.

Optionally, in another specific implementation of this embodiment, when determining the right boundary, the processing unit 2002 may perform the following functions adjusting DLs of all the DQs using the left boundary as a reference such that the minimum values of the margin effective widths of all the DQs are equal to the left boundary, determining a smallest margin effective width of all DQs in the transmission bus, and determining that the right boundary is a maximum value of the smallest margin effective width.

Optionally, in still another specific implementation of this embodiment, the processing unit 2002 is further configured to write and read the preset data at a normal rate, determine a second central position, where during write data training, the second central position is a center of a smallest margin effective width obtained after all the DQs are aligned, adjust a DL of the DQS to the second central position, and assign the first central position and the second central position to a DQS register, and assign, to a DQ register, DL lengths of each DQ that are adjusted relative to the first central position and the second central position.

Optionally, in yet another specific implementation of this embodiment, the processing unit 2002 is further configured to, before the margin effective widths of all the DQs in the transmission bus are obtained, perform a calibration operation on a terminal matching resistor in the transmission bus during power-on or reset, after the calibration operation on the terminal matching resistor is completed, detect whether a bus rate in the transmission bus is greater than a threshold, and if the bus rate is greater than the threshold, perform the step of determining a left boundary and a right boundary based on the margin effective widths, or if the bus rate is less than or equal to the threshold, enter a normal operation state.

Optionally, in still yet another specific implementation of this embodiment, the processing unit 2002 is further configured to, before the margin effective widths of all the DQs in the transmission bus are obtained, obtain an operation mode of a NFI bus, determine a minimum rate in the operation mode of the NFI bus based on the operation mode of the NFI bus and a correspondence between the operation mode of the NFI bus and a bus rate, write the preset data into a data register of a NAND flash at the minimum rate, and obtain the preset data from the data register of the NAND flash.

Figure 21:
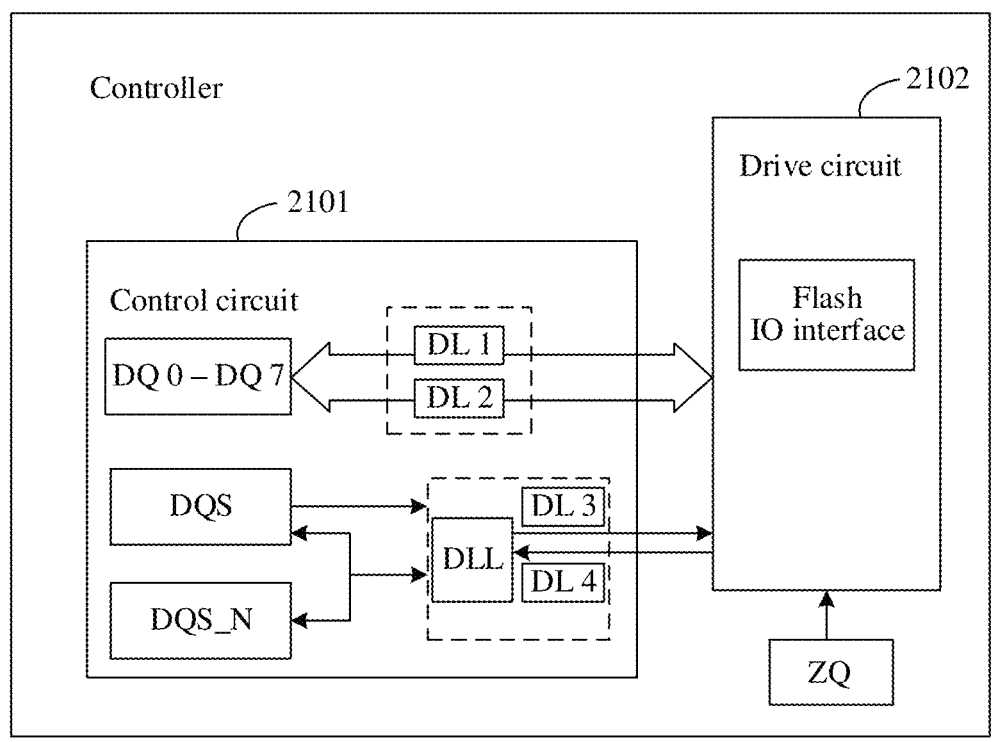
FIG. 21 is a schematic structural diagram of a controller according to this disclosure.

In a specific implementation, the apparatus provided in the foregoing embodiment may be configured in a controller. As shown in FIG. 21, a controller is provided. The controller includes a control circuit 2101 and a drive circuit 2102. In addition, the controller further includes a terminal matching resistor ZQ calibration module. The control circuit 2101 is configured to implement steps in the methods of the foregoing embodiments, and the drive circuit 2102 is configured to be connected to the NAND Flash using the NFI bus.

Specifically, the control circuit 2101 is configured to obtain margin effective widths of all DQs in a transmission bus, where the margin effective width is a signal width in which preset data is correctly sampled by a receive end after the preset data is transmitted to the receive end in an ideal signal width at a transmit end. The control circuit 2101 is further configured to determine a left boundary and a right boundary based on the margin effective widths, where the left boundary is a largest value in minimum values of the margin effective widths of all the DQs, and the right boundary is a smallest value in maximum values of the corresponding margin effective widths when all the DQs are aligned with the left boundary, calculate a first central position based on the left boundary and the right boundary, where the first central position is a center of a smallest margin effective width obtained after all the DQs are aligned during read data training, and adjust a DL of the DQS to the first central position.

Optionally, in another specific implementation of this embodiment, the control circuit 2101 is further configured to perform the following functional steps setting a preset boundary range [a, b], where a indicates a preset left boundary, b indicates a preset right boundary, and a and b are an integral multiple of the step length N, where N is a natural number greater than 1, and determining, using the preset left boundary a as an initial position, whether an error code occurs in data sampled by a DQS at the initial position, if there is no error code, determining that the left boundary is the preset left boundary a, if there is an error code, adjusting the initial position rightwards by N step lengths to obtain a first position, then adjusting the first position leftwards successively by one step length, and until a position obtained after leftward adjustment has an error code and cannot be exactly divided by the step length N, determining that the left boundary is the position obtained by adding 1 to the position obtained after leftward adjustment, adjusting, using the left boundary as a reference, initial positions of all the DQs to be aligned with the left boundary, and determining, using the preset right boundary b as an initial position, whether there is an error code in data sampled by the DQS at the initial position, and if there is no error code, determining that the right boundary is the preset right boundary b, if there is an error code, adjusting the initial position leftwards by the step length N to obtain a second position, then adjusting the second position rightwards successively by one step length, and until a position obtained after rightward adjustment has an error code and cannot be exactly divided by the step length N, determining that the right boundary is a position obtained by subtracting 1 from the position obtained after rightward adjustment.

Optionally, in still another specific implementation of this embodiment, the control circuit 2101 is further configured to perform the following functions adjusting the initial position rightwards by the step length N to obtain a first position X1 (X1=a+N), determining whether the first position X1 is greater than the preset right boundary b, if X1≤b, determining whether there is an error code in sampled data corresponding to the first position X1, if there is no error code, adjusting the first position X1 leftwards by one step length to obtain a third position X3 (X3=X1−1), and determining whether the third position X3 is greater than or equal to the preset left boundary a, if X3≥a, determining, when the third position X3 cannot be exactly divided by the step length N, whether there is an error code in data sampled at the third position X3, and when no error code is detected, performing a process of fine leftward adjustment by gradually subtracting 1, and until it is detected that data at a current position Xn has an error code and cannot be exactly divided by the step length N, determining that the left boundary is the current position Xn+1.

Optionally, in another specific implementation of this embodiment, the control circuit 2101 is further configured to implement the following functions adjusting the initial position leftwards by the step length N to obtain a second position X2 (X2=X1−N), determining whether the second position X2 is less than the preset left boundary a, if X2≥a, determining whether there is an error code in sampled data corresponding to the second position X2, and if there is no error code, adjusting the second position X2 rightwards by one step length to obtain a fourth position X4 (X4=X3+1), and determining whether the fourth position X4 is less than or equal to the preset right boundary b, if X4≤b, determining, when the fourth position X4 cannot be exactly divided by the step length N, whether there is an error code in data sampled at the fourth position X4, and when no error code is detected, performing a process of fine rightward adjustment by gradually plus 1, and until it is detected that data at a current position Xm has an error code and cannot be exactly divided by the step length N, determining that the right boundary is the current position Xm−1.

Optionally, in another specific implementation of this embodiment, the control circuit 2101 is further configured to implement the following functions setting an initial position of the DQS, where the initial position of the DQS is a position obtained after a time delay of ¼ of a DQS cycle, gradually adjusting the DQS position leftwards using the initial position as a start point until the first DQ, in all the DQs, in which an error code occurs is obtained, setting a minimum value of a margin effective width of the last DQ in which an error code occurs as a left boundary, adjusting, using the left boundary as a reference, DLs of remaining DQs to be aligned with the left boundary, and scanning margin effective widths of all the DQs rightwards from the left boundary to determine a DQ having a smallest margin effective width, and using a maximum value of the DQ having a smallest margin effective width as a right boundary.

Optionally, in another specific implementation of this embodiment, the control circuit 2101 is further configured to implement the following functions adjusting the DQS position rightwards from an initial scale value until a minimum value of a margin effective width of the last DQ, in all the DQs, in which no error code occurs is detected, setting the minimum value as a value of a left boundary and adjusting, using the left boundary as a reference, DLs of all the DQs to be aligned with the left boundary, and scanning the margin effective widths of all the DQs rightwards from the left boundary, until the maximum values of the margin effective widths of all the DQs in which an error code occurs is obtained, and using a maximum value of the last DQ in which an error code occurs as a value of a right boundary.

Optionally, in another specific implementation of this embodiment, the control circuit 2101 is further configured to implement the following functions calculating a difference between a margin effective width of each DQ and a margin effective width of the last DQ in which an error code occurs, using a center of the margin effective width of the last DQ in which an error code occurs as a first central position, and adjusting centers of margin effective widths of all remaining DQs based on ½ of each difference to be aligned with the first central position such that centers of margin effective widths of all the DQs are aligned with a DQS position.

Optionally, in another specific implementation of this embodiment, the control circuit 2101 is further configured to implement the following functions writing and reading the preset data at a normal rate, determining a second central position based on the margin effective width corresponding to the preset data, where during write data training, the second central position is a center of a margin effective width corresponding to a second target DQ, and the second target DQ is a DQ having a smallest margin effective width in all DQs in a transmission bus, and assigning the first central position and the second central position to a corresponding DQS register, and assigning, to a corresponding DQ register, DL lengths of each DQ that are adjusted relative to the first central position and the second central position.

Optionally, in another specific implementation of this embodiment, before obtaining margin effective widths of all the DQs in the transmission bus, the control circuit 2101 is further configured to perform a calibration operation on a terminal matching resistor in the transmission bus during power-on or reset, after the calibration operation on the terminal matching resistor is completed, detect whether a bus rate in the transmission bus is greater than a threshold, and if the bus rate is greater than the threshold, perform the step of obtaining margin effective widths of all the DQs in a transmission bus, or if the bus rate is less than or equal to the threshold, enter a normal operation state.

Optionally, in another specific implementation of this embodiment, before obtaining margin effective widths of all the DQs in the transmission bus, the control circuit 2101 is further configured to obtain an operation mode of a NFI bus, determine a minimum rate in the operation mode of the NFI bus based on the operation mode of the NFI bus and a correspondence between the operation mode of the NFI bus and a bus rate, write the preset data into a data register of a NAND flash at the minimum rate, and obtain the preset data from the data register of the NAND flash.

Further, in a specific implementation, the control circuit 2101 includes a DQ 0 register to a DQ 7 register, a DQS register, a DQS_N register, several DL modules, and one DLL module. For example, FIG. 21 shows four DL modules that are respectively represented as a DL 1, a DL 2, a DL 3, and a DL 4. The DQ 0 register to the DQ 7 register are configured to register a DL value for which each DQ needs to be delayed, the DL 1 module is configured to delay the time when eight DQs of a DQ 0 to a DQ 7 are triggered in a read direction, and the DL 2 module is configured to delay the time when eight DQs of the DQ 0 to the DQ 7 are triggered in a write direction.

Similarly, the DL 3 module is configured to delay the time when a DQS are triggered in the read direction, the DL 4 module is configured to delay the time when the DQS are triggered in the write direction, and the DLL module is configured to obtain a DQS cycle.

In addition, the controller further includes another circuit and module, such as a physical layer (PHY) CMDLANE module.

The drive circuit 2102 includes a flash interface configured for data transmission with an NFI bus. The drive circuit 2102 is further connected to a ZQ module, and the ZQ module is configured to perform ZQ calibration operation on a terminal matching resistor on the controller and the NFI bus.

Further, the controller provided in this embodiment can be applied to various flash memory devices such as a SSD, an AIC card, an NGFF (M.2), or a custom type.

In addition, the controller may further include more or few components such as a transceiver, or combine some components, or have different component arrangements. This is not limited in this disclosure.

In addition, in specific implementation, this disclosure further provides a computer storage medium, and the computer storage medium may store a program. When the program is executed, some or all of steps in embodiments of the DQS position determining method provided in this disclosure can be implemented. The storage medium may be stored in a memory, and the controller or the control circuit may execute a program instruction in the storage medium, to perform the method procedure in the foregoing embodiments in order to implement automatic adjustment of a DQS position, thereby improving sampling precision and avoiding an error code during data reading and writing.

A person skilled in the art may clearly understand that, the technologies in the embodiments of the present disclosure may be implemented using software and a necessary general hardware platform. Based on such an understanding, the technical solutions in the embodiments of the present disclosure essentially or the part contributing to other approaches may be implemented in a form of a computer software product. The computer software product may be stored in a storage medium, such as a read-only memory (ROM)/random-access memory (RAM), a magnetic disk, or an optical disc, and include several instructions for instructing a computer device (which may be a personal computer, a server, a network device, or the like) to perform the methods described in the embodiments or some parts of the embodiments of the present disclosure.

For same or similar parts between the embodiments in this specification, reference may be made to each other. Especially, the method embodiments of determining the left boundary and the right boundary in the manner 2 and the manner 3 are basically similar to the embodiment in the manner 1, and therefore are described briefly. For related parts, refer to descriptions in the method embodiments.

In addition, a data pattern described in the custom timing training data list in FIG. 8 in this disclosure is only a specific implementation solution in this disclosure, and different specific implementation solutions generated by splitting, merging or partially applying different data patterns belong to the protection scope of the present disclosure.

The automatic adjustment step described in the schematic diagram of the timing margin training method in FIG. 7 in this disclosure is only a specific implementation solution in this disclosure, and different specific implementation schemes generated by splitting, merging or partially applying different steps belong to the protection scope of the present disclosure.

The foregoing implementations of this disclosure are not intended to limit the protection scope of this disclosure.

What is claimed is:

1. A data strobe signal (DQS) position adjustment method comprising:
    writing preset data to a memory of a device;
    reading all data signals of the preset data form from the memory;
    sampling the data signals correctly to obtain a plurality of margin effective widths of the data signals;
    determining a left boundary and a right boundary based on the margin effective widths, wherein the left boundary is a largest value in a plurality of minimum values of the margin effective widths, and wherein the right boundary is a smallest value in a plurality of maximum values of the margin effective widths when all the data signals are aligned with the left boundary;

calculating a central position based on the left boundary and the right boundary; and adjusting a delay line (DL) of the DQS to the central position.

2. The DQS position adjustment method of claim 1, wherein the step of determining a left boundary comprises:
setting a first position of the DQS, wherein no error code occurs in first sampled data corresponding to the first position;
adjusting the first position to the left in a first unit of step lengths;
determining whether the error code occurs in the first sampled data; and
adjusting the first position until the error code occurs in the first sampled data and determining that the left boundary is a position by adjusting a currently adjusted first position at which the error code occurs rightwards by a plurality of step lengths, wherein a first quantity of the first unit of step lengths is greater than or equal to a second quantity of the step lengths and the second quantity is greater than 1.

3. The DQS position adjustment method of claim 1, wherein the step of determining a left boundary comprises:
setting a second position of the DQS, wherein an error code occurs in second sampled data corresponding to the second position;
adjusting the second position to the right in a second unit of step lengths;
determining whether the error code occurs in the second sampled data; and
performing either first steps when a third quantity of the second unit of step lengths being greater than or equal to 2 or second steps when the third quantity of the second quantity of the third unit of step lengths being equal to 1, wherein the first steps comprise adjusting the second position until the error code does not occur in the second sampled data and determining that the left boundary is a position by adjusting a currently adjusted second position at which the error code does not occur leftwards by a plurality of step lengths in response to the second unit of step lengths being greater than or equal to 2, wherein the third quantity of the second unit of step lengths is greater than or equal to a fourth quantity of the step lengths and the fourth quantity is greater than 1, and the second steps comprise adjusting the second position until the error code does not occur in the second sampled data and determining that the left boundary is the currently adjusted position in response to the third quantity of the third unit of step lengths being equal to 1.

4. The DQS position adjustment method of claim 1, wherein the step of determining a right boundary comprises:
adjusting a plurality of DLs of the data signals using the left boundary as a reference such that the minimum values of the margin effective widths are equal to the left boundary;
determining a smallest margin effective width in the data signals; and
determining that the right boundary is a maximum value of the smallest margin effective width.

5. The DQS position adjustment method of claim 1, wherein writing the preset data to the memory of the device comprises writing the preset data at a low rate, and wherein the DQS position adjustment method further comprises assigning the central position as the DL of the DQS of a read operation to a DQS register.

6. The DQS position adjustment method of claim 1, wherein the step of writing preset data to a memory of a device comprises writing the preset data at a normal rate, the DQS position adjustment method further comprises:
assigning the central position as the DL of the DQS of a write operation to a DQS register.

7. The DQS position adjustment method of claim 5, wherein the memory is a NAND flash, the step of writing the preset data at a low rate comprises:
obtaining an operation mode of a non-volatile flash interface (NFI) bus;
determining a minimum rate in the operation mode of the NFI bus based on the operation mode and a correspondence between the operation mode and a bus rate; and
writing the preset data into a memory of the NAND flash at the minimum rate.

8. A controller comprising:
a control circuit;
a drive circuit coupled to the control circuit and configured to implement data transmission between the controller and a memory of a device;
wherein the control circuit being configured to execute instructions in a storage medium to:
write preset data to the memory;
read all data signals of the preset data form from the memory;
sample the data signals correctly to obtain a plurality of margin effective widths of the data signals;
determine a left boundary and a right boundary based on the margin effective widths, wherein the left boundary is a largest value in a plurality of minimum values of the margin effective widths, and wherein the right boundary is a smallest value in a plurality of maximum values of the margin effective widths when all the data signals are aligned with the left boundary;
calculate a central position based on the left boundary and the right boundary; and
adjust a delay line (DL) of the DQS to the central position.

9. The controller of claim 8, wherein the control circuit being further configured to execute the instructions in a storage medium to:
set a first position of the DQS, wherein no error code occurs in first sampled data corresponding to the first position;
adjust the first position to the left in a first unit of step lengths;
determine whether the error code occurs in the first sampled data; and
adjust the first position until the error code occurs in the first sampled data and determining that the left boundary is a position by adjusting a currently adjusted first position at which the error code occurs rightwards by a plurality of step lengths, wherein a first quantity of the first unit of step lengths is greater than or equal to a second quantity of the step lengths and the second quantity is greater than 1.

10. The controller of claim 8, wherein the control circuit being further configured to execute the instructions in a storage medium to:
set a second position of the DQS, wherein an error code occurs in second sampled data corresponding to the second position;
adjust the second position to the right in a second unit of step lengths;
determine whether the error code occurs in the second sampled data; and performing either first steps when a third quantity of the second unit of step lengths being greater than or equal to 2 or second steps when the third quantity of the second quantity of the third unit of step lengths being equal to 1, wherein the first steps comprise adjusting the second position until the error code does not occur in the second sampled data and determining that the left boundary is a position by adjusting a currently adjusted second position at which the error code does not occur leftwards by a plurality of step lengths in response to the second unit of step lengths being greater than or equal to 2, wherein the third quantity of the second unit of step lengths is greater than or equal to a fourth quantity of the step lengths and the fourth quantity is greater than 1, and the second steps comprise adjusting the second position until the error code does not occur in the second sampled data and determining that the left boundary is the currently adjusted position in response to the third quantity of the third unit of step lengths being equal to 1.

11. The controller of claim 8, wherein the control circuit being further configured to execute the instructions in a storage medium to:
adjust a plurality of DLs of the data signals using the left boundary as a reference such that the minimum values of the margin effective widths are equal to the left boundary;
determine a smallest margin effective width in the data signals; and
determine that the right boundary is a maximum value of the smallest margin effective width.

12. The controller of claim 8, wherein the function of writing preset data to the memory of a device configured to write the preset data at a normal rate, the control circuit being further configured to execute the instructions in a storage medium to:
assign the central position as the DL of the DQS of a write operation to a DQS register.

13. The controller of claim 8, wherein the function of writing preset data to a memory of a device configured to write the preset data at a low rate, the control circuit is further configured to:
assign the central position as the DL of the DQS of a read operation to a DQS register.

14. The controller of claim 12, wherein the memory is a NAND flash, the control circuit being further configured to execute the instructions in a storage medium to:
obtain an operation mode of a non-volatile flash interface (NH) bus;
determine a minimum rate in the operation mode of the NFI bus based on the operation mode and a correspondence between the operation mode and a bus rate; and
write the preset data into a memory of the NAND flash at the minimum rate.

15. A network device comprising:
a controller; and
a storage medium coupled to the controller and configured to store instructions that, when executed by the controller, cause the network device to be configured to:
write preset data to a memory of a device;
read all data signals of the preset data form from the memory;
sample the data signals correctly to obtain a plurality of margin effective widths of the data signals;
determine a left boundary and a right boundary based on the margin effective widths, wherein the left boundary is a largest value in a plurality of minimum values of the margin effective widths, and wherein the right boundary is a smallest value in a plurality of maximum values of the margin effective widths when all the data signals are aligned with the left boundary;
calculate a central position based on the left boundary and the right boundary; and
adjust a delay line (DL) of the DQS to the central position.

16. The network device of claim 15, wherein the instructions further cause the network device to be configured to:
set a first position of the DQS, wherein no error code occurs in first sampled data corresponding to the first position;
adjust the first position to the left in a first unit of step lengths;
determine whether the error code occurs in the first sampled data; and
adjust the first position until the error code occurs in the first sampled data and determining that the left boundary is a position by adjusting a currently adjusted first position at which the error code occurs rightwards by a plurality of step lengths, wherein a first quantity of the first unit of step lengths is greater than or equal to a second quantity of the step lengths and the second quantity is greater than 1.

17. The network device of claim 15, wherein the instructions further cause the network device to be configured to:
set a second position of the DQS, wherein an error code occurs in second sampled data corresponding to the second position;
adjust the second position to the right in a second unit of step lengths;
determine whether the error code occurs in the second sampled data; and
performing either first steps when a third quantity of the second unit of step lengths being greater than or equal to 2 or second steps when the third quantity of the second quantity of the third unit of step lengths being equal to 1, wherein the first steps comprise adjusting the second position until the error code does not occur in the second sampled data and determining that the left boundary is a position by adjusting a currently adjusted second position at which the error code does not occur leftwards by a plurality of step lengths in response to the second unit of step lengths being greater than or equal to 2, wherein the third quantity of the second unit of step lengths is greater than or equal to a fourth quantity of the step lengths and the fourth quantity is greater than 1, and the second steps comprise adjusting the second position until the error code does not occur in the second sampled data and determining that the left boundary is the currently adjusted position in response to the third quantity of the third unit of step lengths being equal to 1.

18. The network device of claim 15, wherein the instructions further cause the network device to be configured to:
adjust a plurality of DLs of the data signals using the left boundary as a reference such that the minimum values of the margin effective widths are equal to the left boundary;
determine a smallest margin effective width in the data signals; and
determine that the right boundary is a maximum value of the smallest margin effective width.

19. The network device of claim 15, wherein the function of writing preset data to a memory of a device configured to write the preset data at a normal rate, in the instructions further cause the network device to be configured to:
assign the central position as the DL of the DQS of a write operation to a DQS register.

20. The network device of claim 15, wherein the function of writing preset data to a memory of a device configured to write the preset data at a low rate, the instructions further cause the network device to be configured to:
  assign the central position as the DL of the DQS of a read operation to a DQS register.

* * * * *